(12) United States Patent
Shimomura et al.

(10) Patent No.: US 8,753,907 B2
(45) Date of Patent: Jun. 17, 2014

(54) SEMICONDUCTOR LIGHT EMITTING DEVICE AND METHOD FOR MANUFACTURING THE SAME

(75) Inventors: Kenji Shimomura, Fukuoka-ken (JP); Tetsuro Komatsu, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 13/414,497

(22) Filed: Mar. 7, 2012

(65) Prior Publication Data

US 2012/0319150 A1    Dec. 20, 2012

(30) Foreign Application Priority Data

Jun. 17, 2011    (JP) ................................. 2011-135585

(51) Int. Cl.
*H01L 33/60* (2010.01)
(52) U.S. Cl.
USPC .............................................. 438/29; 257/98
(58) Field of Classification Search
USPC ........................................................ 257/98
See application file for complete search history.

(56) References Cited

U.S. PATENT DOCUMENTS 6,747,293 B2 * 6/2004 Nitta et al. ........................ 257/99
8,487,418 B2 * 7/2013 Egoshi et al. ................. 257/676
2006/0079027 A1 * 4/2006 Yamada ........................ 438/121
2010/0163920 A1 7/2010 Itai
2011/0186868 A1 8/2011 Watari et al.
2011/0186901 A1 8/2011 Ushiyama et al.
2011/0193112 A1 8/2011 Inoue et al.

FOREIGN PATENT DOCUMENTS

JP    2010-140942    6/2010
JP    4608294    10/2010

OTHER PUBLICATIONS

U.S. Appl. No. 13/053,522, filed Mar. 22, 2011.
U.S. Appl. No. 13/289,587, filed Nov. 4, 2011.

* cited by examiner

*Primary Examiner* — Telly Green
*Assistant Examiner* — Damian A Hillman
(74) *Attorney, Agent, or Firm* — Patterson & Sheridan, LLP

(57) ABSTRACT

According to one embodiment, a method for manufacturing a semiconductor light emitting device includes: preparing a metal plate including first frames and second frames, the first frames and the second frames being alternately arranged and spaced from each other, a light emitting element being fixed to each of the first frames, the light emitting element being connected to an adjacent one of the second frames via a metal wire; molding a first resin on the metal plate, the first resin covering the first frame, the second frame, and the light emitting element; forming in the first resin a groove defining a resin package including the first frame, the second frame, and the light emitting element; filling a second resin inside the groove; and forming the resin package with an outer edge of the first resin covered with the second resin by cutting the second resin along the groove.

21 Claims, 23 Drawing Sheets

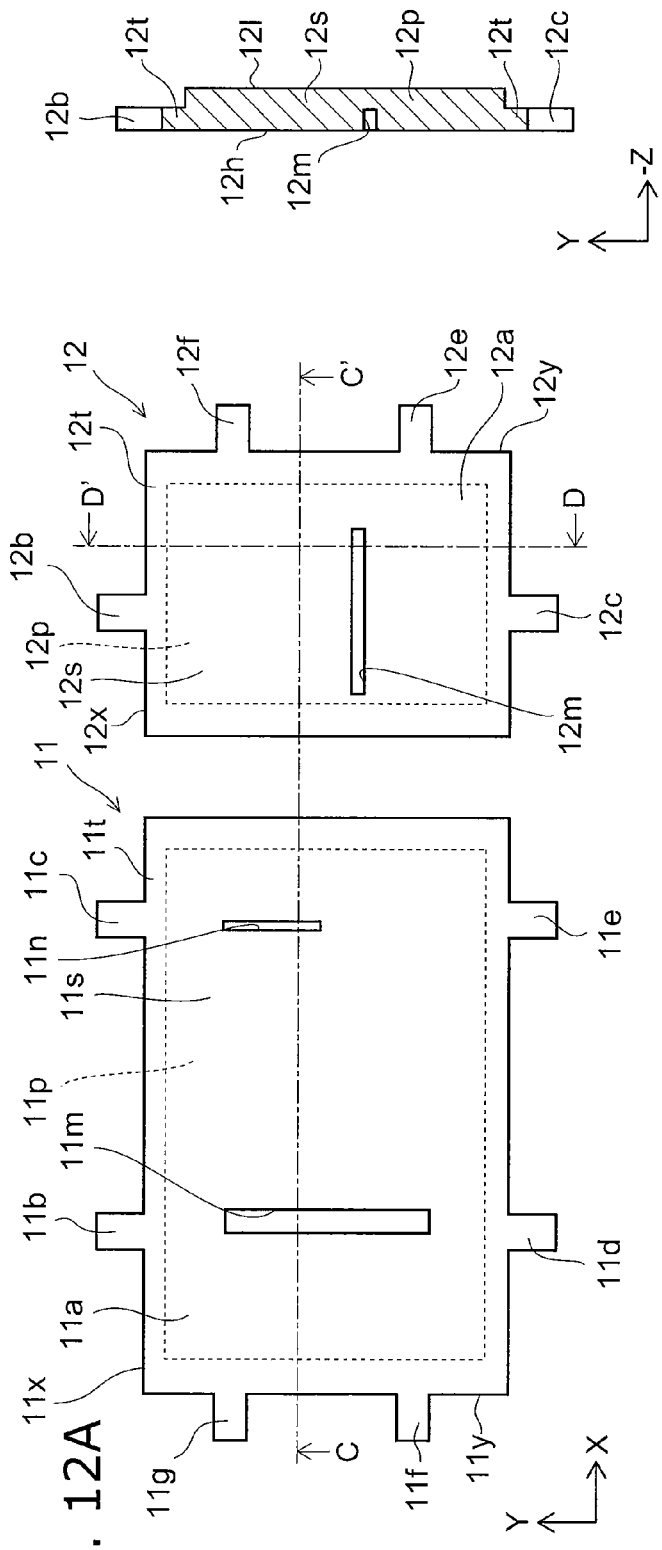
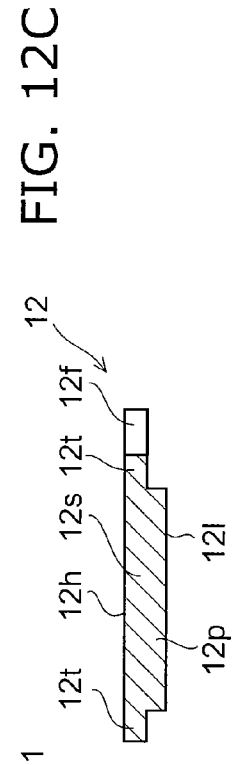
FIG. 12C
FIG. 12A
FIG. 12B

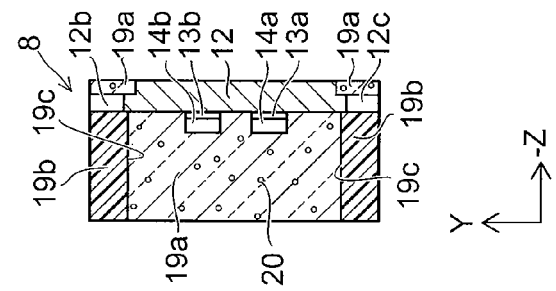
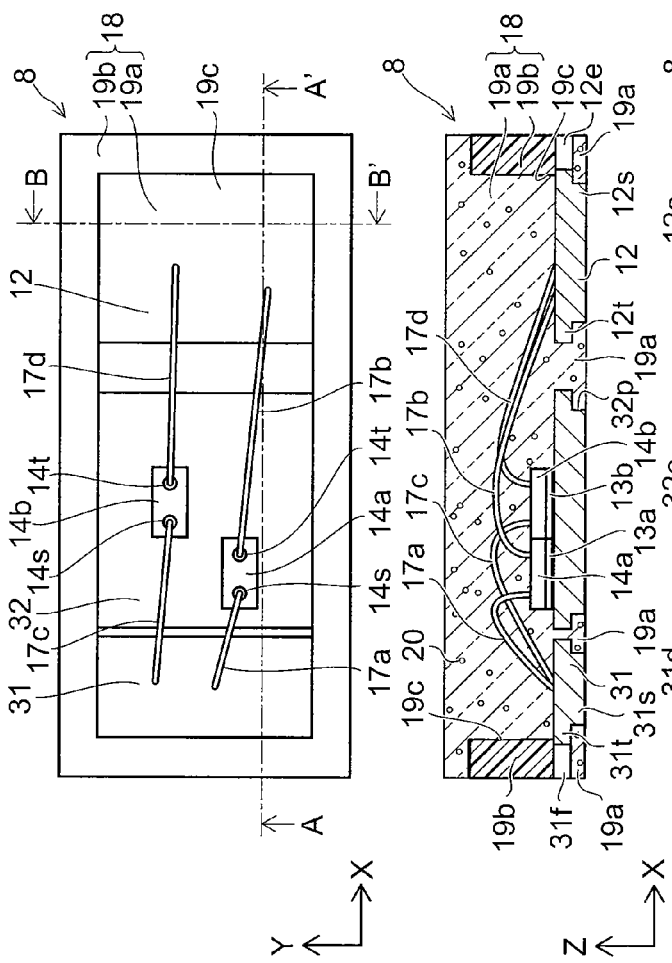
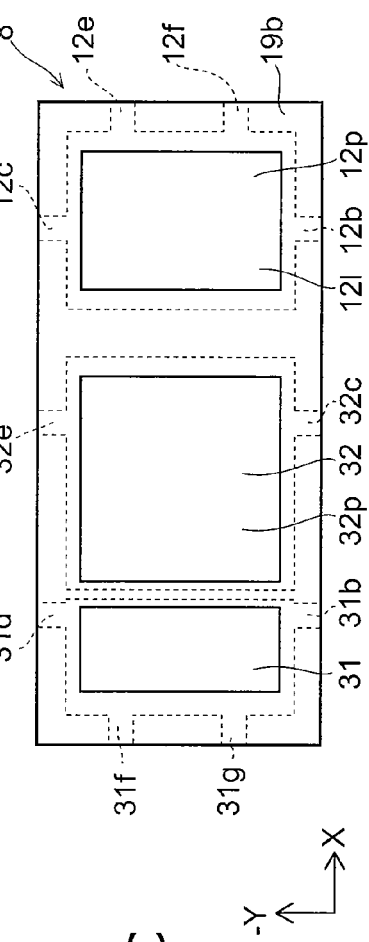
FIG. 16A  FIG. 16B  FIG. 16C  FIG. 16D

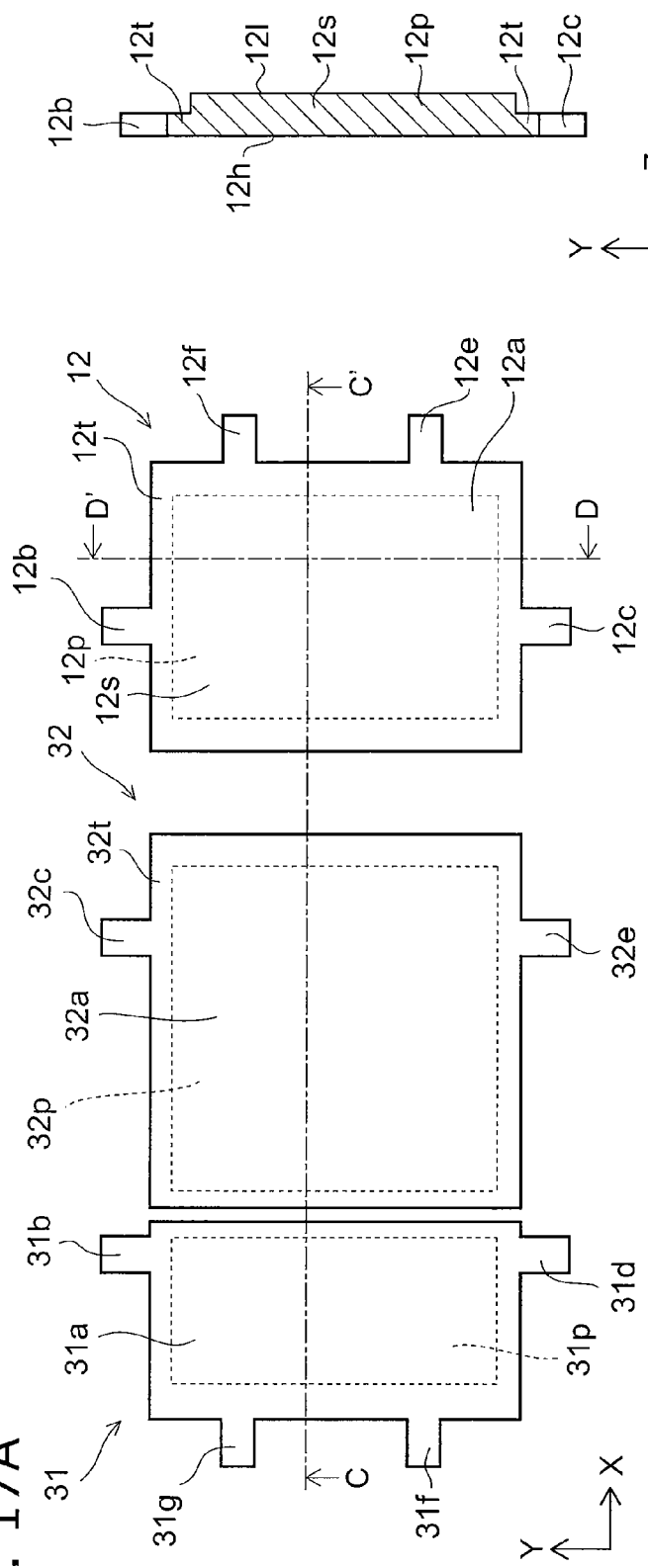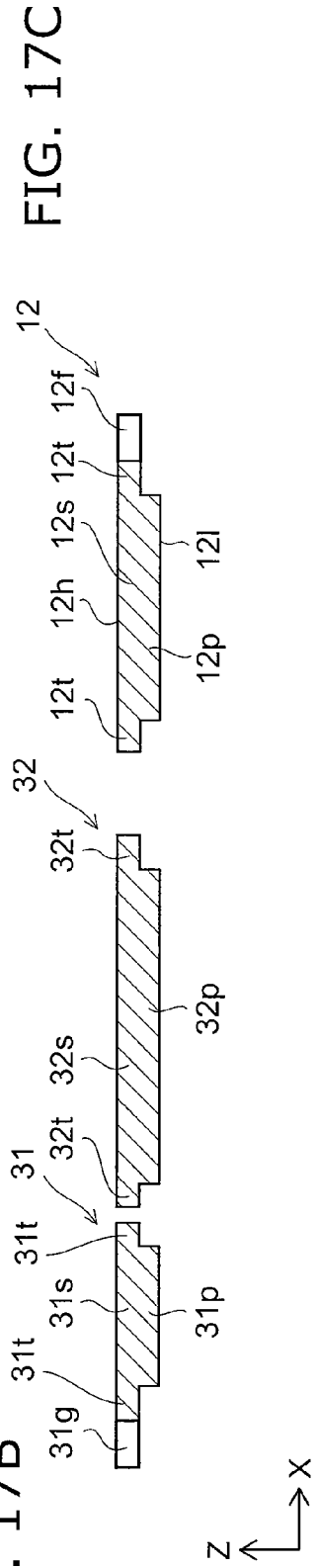

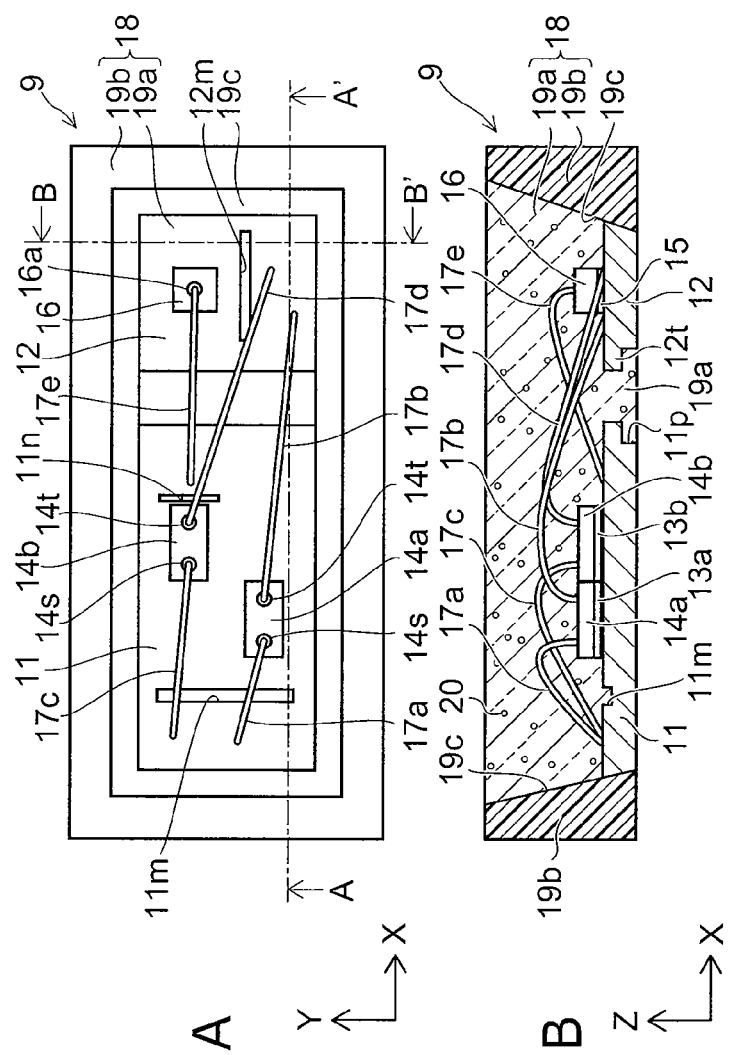

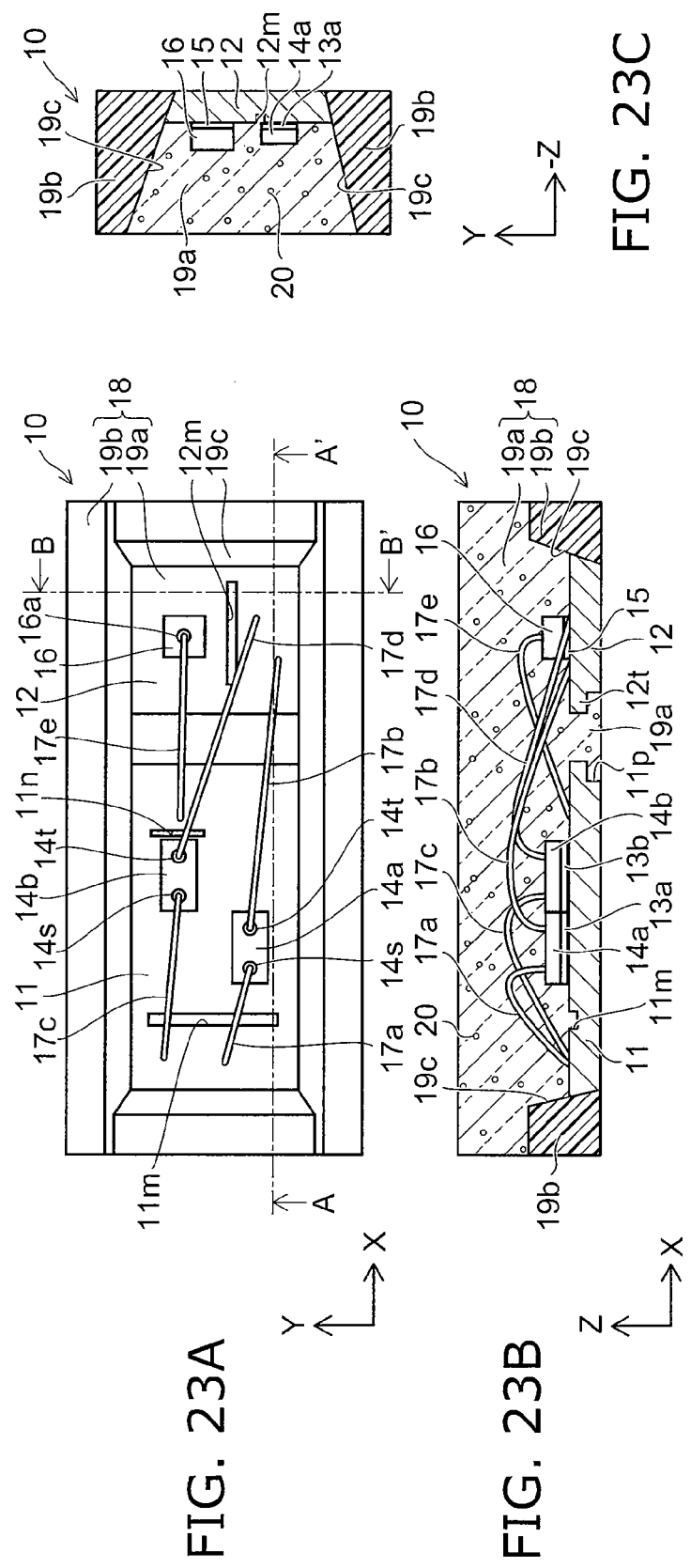

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from the prior Japanese Patent Application No. 2011-135585, filed on Jun. 17, 2011; the entire contents of which are incorporated herein by reference.

FIELD

Embodiments described herein relate generally to a semiconductor light emitting device and a method for manufacturing the same.

BACKGROUND

Semiconductor light emitting devices have lower power consumption and longer lifetime than conventional bulb light sources. Thus, semiconductor light emitting devices are finding various applications such as display units and lighting fixtures. For instance, a semiconductor light emitting device including a light emitting diode (LED) is suitable for downsizing and low voltage operation, and its light emission can be easily controlled. Hence, it has widespread application.

On the other hand, in order to respond to further energy saving, there is demand for techniques to efficiently use the light emitted from the semiconductor light emitting device and to reduce power consumption. For instance, the package of a semiconductor light emitting device including an LED is provided with an enclosure for reflecting the light emission of the LED to control light distribution. However, the suitable light distribution depends on the purpose of the semiconductor light emitting device. Forming the enclosure adapted to different light distributions incurs increased cost. Thus, there is need for a semiconductor light emitting device and a method for manufacturing the same capable of realizing light distribution control at low cost and adaptable to widespread application.

BRIEF DESCRIPTION OF THE DRAWINGS

FIGS. 12A to 12C illustrate the lead frames of the semiconductor light emitting device according to the fourth embodiment;

FIGS. 16A to 16D are schematic views illustrating the detailed structure of the semiconductor light emitting device according to the sixth embodiment;

FIGS. 17A to 17C illustrate the lead frames of the semiconductor light emitting device according to the sixth embodiment;

FIGS. 19A to 19C are schematic views illustrating the detailed structure of the semiconductor light emitting device according to the seventh embodiment;

FIGS. 23A to 23C are schematic views illustrating the detailed structure of the semiconductor light emitting device according to the eighth embodiment;

DETAILED DESCRIPTION

Figure 1:
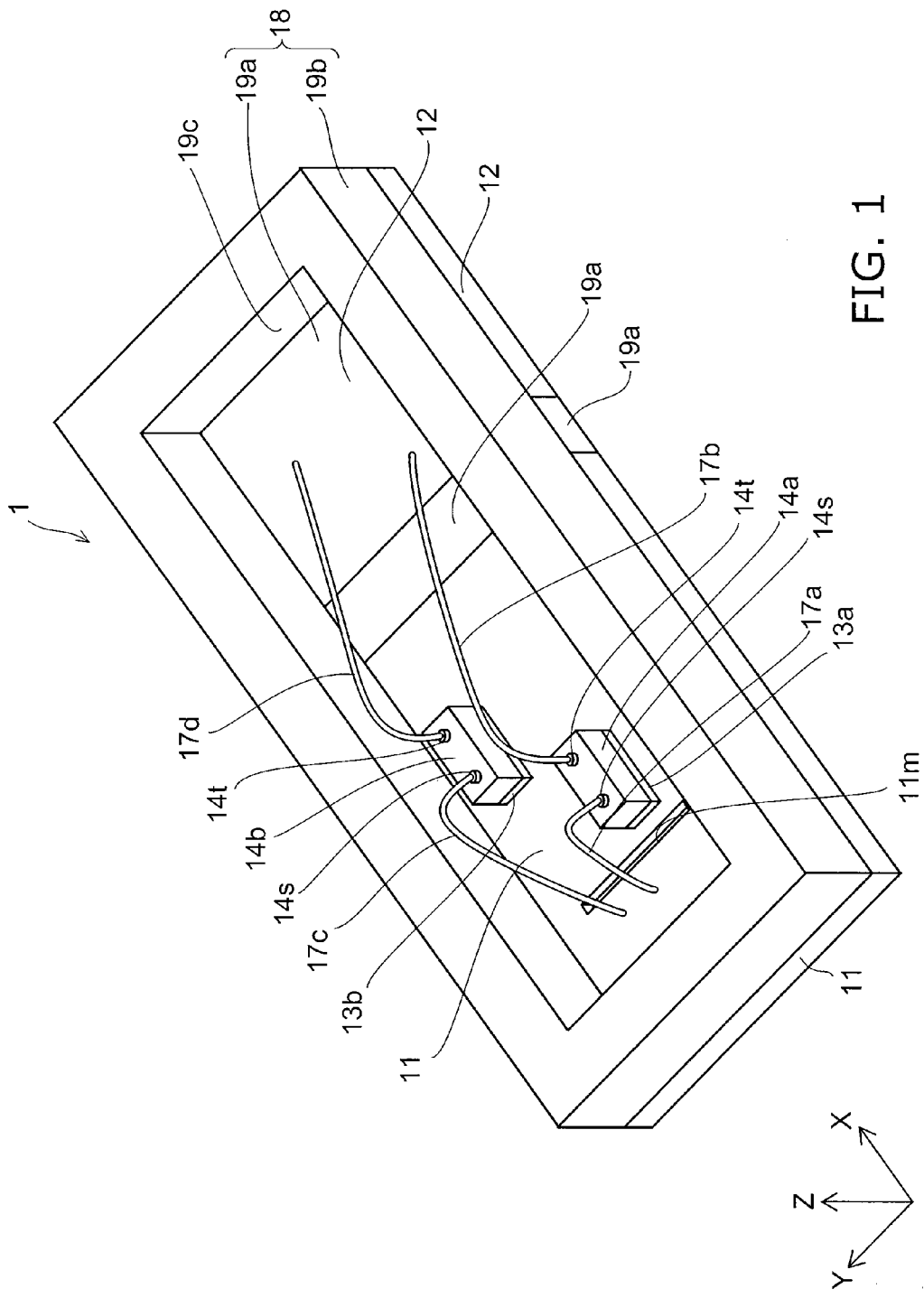
FIG. 1 is a perspective view illustrating a semiconductor light emitting device according to a first embodiment.

In general, according to one embodiment, a method for manufacturing a semiconductor light emitting device includes: preparing a metal plate including a plurality of first frames and a plurality of second frames, the first frames and the second frames being alternately arranged and spaced from each other, a light emitting element being fixed to each of the first frames, the light emitting element being connected to an adjacent one of the second frames via a metal wire; molding a first resin on the metal plate, the first resin covering the first frame, the second frame, and the light emitting element; forming in the first resin a groove defining a resin package including the first frame, the second frame, and the light emitting element; filling a second resin inside the groove; and forming the resin package with an outer edge of the first resin covered with the second resin by cutting the second resin along the groove.

In general, according to another embodiment, a semiconductor light emitting device includes: a first frame; a light emitting element fixed to the first frame; a second frame spaced from the first frame and electrically connected to an electrode of the light emitting element via a metal wire; and a resin package including a first resin covering the light emitting element, the first frame, and the second frame, and a second resin covering an outer edge of the first resin and reflecting light emitted by the light emitting element, a back surface of the first frame on opposite side from a front surface with the light emitting element fixed thereto, and a back surface of the second frame on opposite side from a front surface with the metal wire connected thereto, being exposed at one major surface of the resin package, an end surface of the first frame and an end surface of the second frame being exposed at a plurality of side surfaces crossing the major surface, thickness of the first frame being thinner at the end surface than in a portion with the light emitting element fixed thereto, and thickness of the second frame being thinner at the end surface than in a portion with the metal wire connected thereto.

In general, according to another embodiment, a semiconductor light emitting device includes: a first frame; a light emitting element fixed to the first frame; a second frame spaced from the first frame and electrically connected to an electrode of the light emitting element via a metal wire; and a resin package including a first resin covering the light emitting element, the first frame, and the second frame, and a second resin covering an outer edge of the first resin and reflecting light emitted by the light emitting element, a back surface of the first frame on opposite side from a front surface with the light emitting element fixed thereto, and a back surface of the second frame on opposite side from a front surface with the metal wire connected thereto, being exposed at one major surface of the resin package, and in plan view parallel to the major surface, the first frame and the second frame being located inside an outer edge of the resin package.

Embodiments will now be described with reference to the drawings. Like portions in the drawings are labeled with like reference numerals, with the detailed description thereof omitted appropriately, and the different portions are described appropriately. In this description, for convenience, the configuration of the semiconductor light emitting device is described based on the XYZ orthogonal coordinate system shown in each figure.

(First Embodiment)

FIG. 1 is a perspective view illustrating a semiconductor light emitting device 1 according to a first embodiment. The semiconductor light emitting device 1 includes a light emitting element 14, a lead frame 11 as a first frame, a lead frame 12 as a second frame, and a resin package 18.

As shown in FIG. 1, the semiconductor light emitting device 1 includes an LED 14a and an LED 14b as the light emitting element 14. On the front surface of the lead frame 11, the LED 14a and 14b are fixed. The lead frame 12 is spaced in the X direction from the lead frame 11. The lead frame 12 is connected to the electrodes 14t of the LED 14a and 14b by metal wires 17b and 17d, respectively.

The lead frames 11 and 12 are e.g. flat plates juxtaposed on the same plane, and made of the same conductive material. The lead frames 11 and 12 are e.g. copper plates, with the front surface and back surface plated with silver. Thus, the lead frames 11 and 12 reflect the light emitted by the LED 14a and 14b.

The resin package 18 includes a first resin 19a covering the LED 14a, the LED 14b, the lead frame 11, and the lead frame 12, and a second resin 19b covering the outer edge of the first resin 19a.

The first resin 19a is a transparent resin transmitting the light emitted by the LED 14a and 14b. The second resin 19b includes a material reflecting the light of the LED 14a and 14b. The second resin 19b can be made of e.g. a white resin including fine powder of titanium oxide as a reflective material.

By the above configuration, the light emitted from the LED 14a and 14b is reflected at the inner surface 19c of the second resin 19b and the front surface of the lead frames 11 and 12 and emitted in the Z direction. That is, the second resin 19b functions as an enclosure for controlling the light distribution characteristics of the semiconductor light emitting device 1. For instance, the reflectance can be varied by controlling the amount of reflective material included in the second resin to change the light distribution characteristics. Furthermore, the light distribution characteristics may be controlled by changing the thickness of the second resin 19b in the X and Y directions.

To increase the degree of contact between the first resin 19a and the second resin 19b, the first resin 19a and the second resin 19b preferably include the same material. For instance, the first resin 19a and the second resin 19b can be composed primarily of silicone resin.

In this description, "to cover" is a concept including both the case where what covers is in contact with what is covered and the case where they are not in contact. For instance, between the LED 14a and 14b, and the first resin 19a covering them, a different material may be interposed.

The LED 14a and 14b used in this embodiment is made of e.g. semiconductor layers including e.g. gallium nitride (GaN) stacked on a sapphire substrate. The chip shape thereof is e.g. a rectangular solid. On the upper surface thereof, electrodes 14s and 14t are provided. The LED 14a and 14b emits e.g. blue light by passing a driving current between the electrode 14s and the electrode 14t.

As shown in FIG. 1, the LED 14a and 14b is fixed via a die mounting material 13a and 13b attached to the front surface of the lead frame 11. In the LED 14a and 14b according to this embodiment, the active region (light emitting section) is electrically isolated from the back surface of the chip by an insulative substrate (sapphire substrate). Hence, the die mounting material 13a and 13b may be either conductive or insulative. The die mounting material 13a and 13b can be made of e.g. silver paste, solder, or eutectic solder. Alternatively, the die mounting material 13a and 13b may be e.g. an adhesive made of transparent resin paste.

The electrode 14t of the LED 14a and 14b is connected to the lead frame 12 via a metal wire 17b and 17d. On the other hand, the electrode 14s is electrically connected to the lead frame 11 via a metal wire 17a and 17c. Thus, a driving current can be passed between the lead frame 11 and the lead frame 12 to cause the LED 14a and 14b to emit light.

In the lead frame 11, a groove 11m recessed from the front surface toward the back surface is provided. The groove 11m restricts spreading in the X and Y directions of the die mounting material 13 applied to the front surface of the lead frame 11. This prevents contamination of the bonding surface of the metal wires 17a and 17b bonded across the groove 11m to increase the bonding strength between the lead frame 11 and the metal wires 17a and 17b.

The number of light emitting elements fixed to the lead frame 11 is not limited to two as in the above example, but may be one, or more than two. By mounting a plurality of elements having the same emission wavelength, the optical output can be increased. By mounting three light emitting elements for emitting red (R), green (G), and blue (B) light, white light can also be emitted.

Furthermore, phosphor can be dispersed in the first resin 19a to convert the wavelength of the light emitted from the LED 14a and 14b. For instance, silicate-based phosphor can be dispersed in the first resin 19a to absorb part of the blue light emitted from the LED 14a and 14b and to emit yellow fluorescence. Then, the semiconductor light emitting device 1 emits white light in which the blue light emitted by the LED 14a and 14b is mixed with the yellow light emitted from the phosphor 20.

Next, a method for manufacturing the semiconductor light emitting device 1 is described with reference to FIGS. 2A to 4C. FIGS. 2A to 3D are sectional views schematically illustrating a process for manufacturing the semiconductor light emitting device 1. FIGS. 4A to 4C are sectional views schematically illustrating the process for vacuum molding.

First, on the front surface of a metal plate 23, a first resin 19a covering the LED 14, the lead frame 11, and the lead frame 12 is molded. In the metal plate 23, a plurality of lead frames 11 and a plurality of lead frames 12 are alternately arranged (see FIGS. 12A to 12C).

Figure 2A:
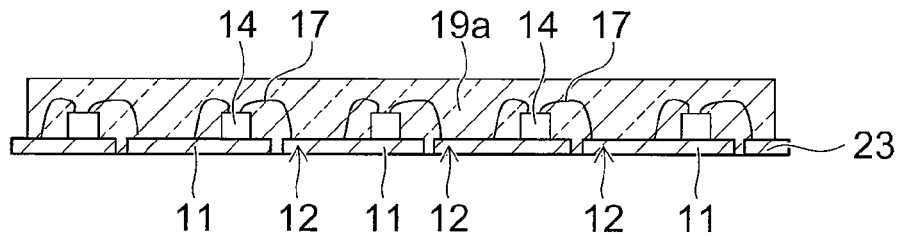
FIGS. 2A to 2D are sectional views schematically illustrating a process for manufacturing the semiconductor light emitting device according to the first embodiment.

In the example shown in FIG. 2A, the portions constituting the lead frame 11 and the lead frame 12 are integrally formed. In a subsequent step, these portions are separated into the lead frame 11 and the lead frame 12. To the front surface of the lead frame 11, the LED 14 is fixed. The electrode thereof is electrically connected to the portion constituting the lead frame 12 by a metal wire 17.

Next, for instance, by using the vacuum molding method shown in FIGS. 4A to 4C, a first resin 19a is formed on the front surface of the metal plate 23.

As shown in FIG. 4A, to the back surface of the metal plate 23, a reinforcing sheet 24 made of polyimide is affixed. The metal plate 23 is attached to the engagement surface (lower surface) of an upper die 102 via the reinforcing sheet 24. On the other hand, the lower die 101 corresponding to the upper die 102 has a recess 101a shaped like a rectangular solid in the engagement surface (upper surface). The recess 101a is filled with a resin material 26 constituting the first resin 19a.

The resin material 26 can be dispersed with a prescribed phosphor. For instance, transparent silicone resin is mixed with phosphor and stirred to prepare a resin material 26 including phosphor in liquid or semi-liquid state. In the case of mixing phosphor in transparent silicone resin, a thixotropic agent is used to uniformly disperse the phosphor. Then, in the recess 101a, the resin material 26 dispersed with phosphor is filled using a dispenser.

Next, as shown in FIG. 4B, the upper die 102 and the lower die 101 are clamped. Thus, the resin material 26 is attached to the front surface of the metal plate 23. At this time, the space between the upper die 102 and the lower die 101 is evacuated so that the resin material 26 gaplessly and uniformly covers the LED 14, the metal wire 17, and the lead frames 11 and 12. Subsequently, the temperature of the dies is increased to cure the resin material 26.

Next, as shown in FIG. 4C, the upper die 102 and the lower die 101 are opened to release the first resin 19a from the recess 101a. Subsequently, the metal plate 23 is detached from the upper die 102. The reinforcing sheet 24 is peeled from the back surface of the metal plate 23. Thus, the first resin 19a is formed on the front surface of the metal plate 23.

Figure 2B:
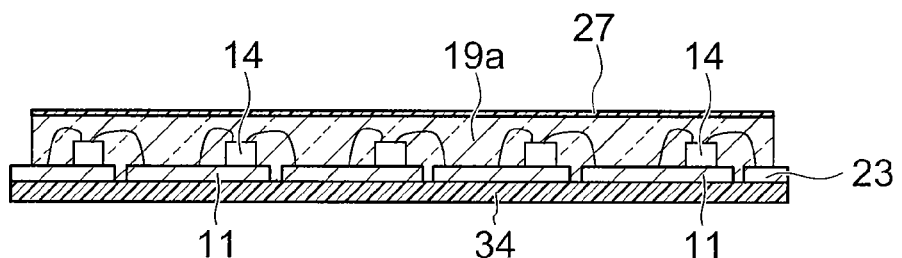

Next, as shown in FIG. 2B, a sacrificial sheet 27 is affixed to the front surface of the first resin 19a. The sacrificial sheet 27 is e.g. a heat-resistant sheet having lower adhesiveness than the dicing sheet 34. It is also possible to use an UV sheet whose adhesiveness is decreased by ultraviolet irradiation.

Figure 2C:
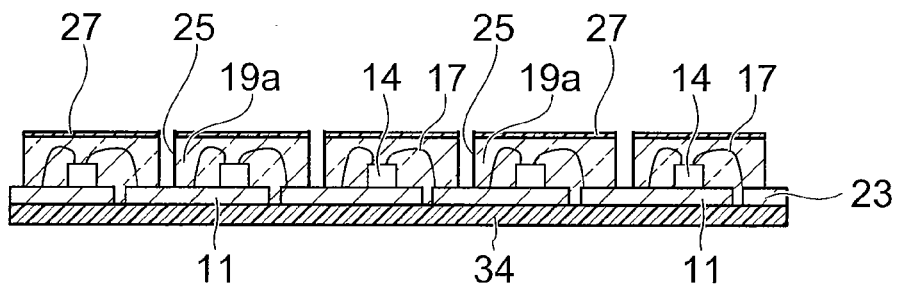
Figure 2D:
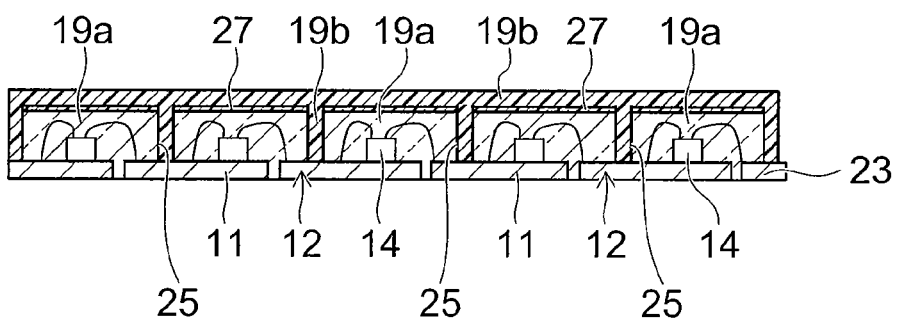

Subsequently, as shown in FIG. 2C, a groove 25 along the outer periphery of the resin package 18 including the first resin 19a is formed on the metal plate 23. The groove 25 is formed by e.g. cutting at least part of the first resin 19a using a dicing blade.

Next, for instance, by using the vacuum molding method shown in FIG. 4B, a second resin 19b covering the first resin 19a is formed. Thus, the second resin 19b is filled also inside the groove 25. The resin material 26 forming the second resin 19b is dispersed with e.g. fine powder of titanium oxide.

Subsequently, the metal plate 23 is affixed to a dicing sheet 35. The second resin 19b is divided along the groove 25 by a dicing blade. The dicing blade used at this time has a narrower width than the dicing blade used to form the groove 25. Thus, the width of the groove 37 dividing the second resin 19b is made narrower than the width of the groove 25. Accordingly, the second resin 19b covering the outer edge (side surface) of the first resin 19a can be formed. The groove 37 is formed so as to cut the metal plate 23 to the depth reaching the dicing sheet 35. Thus, the lead frame 11 and the lead frame 12 are separated.

Figure 3A:
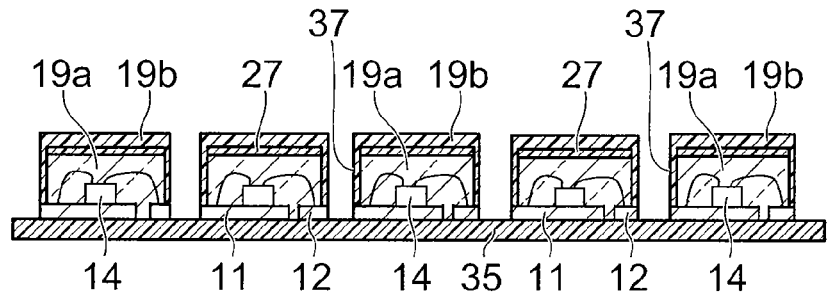
FIGS. 3A to 3D are sectional views schematically illustrating a process for manufacturing the semiconductor light emitting device following FIGS. 2A to 2D.
Figure 3B:
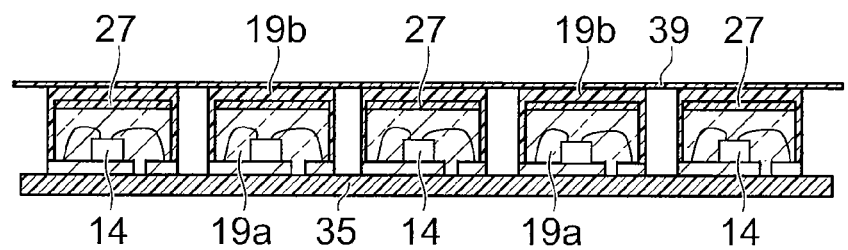
Figure 3C:
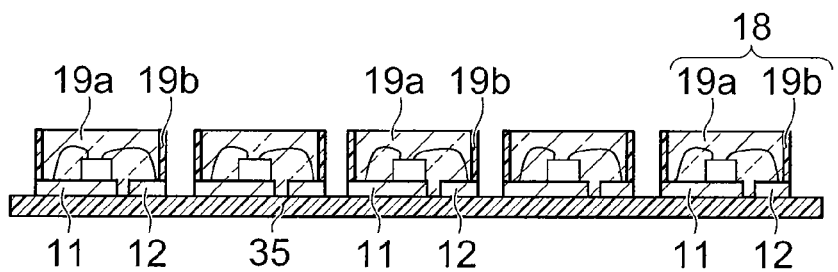
Figure 4A:
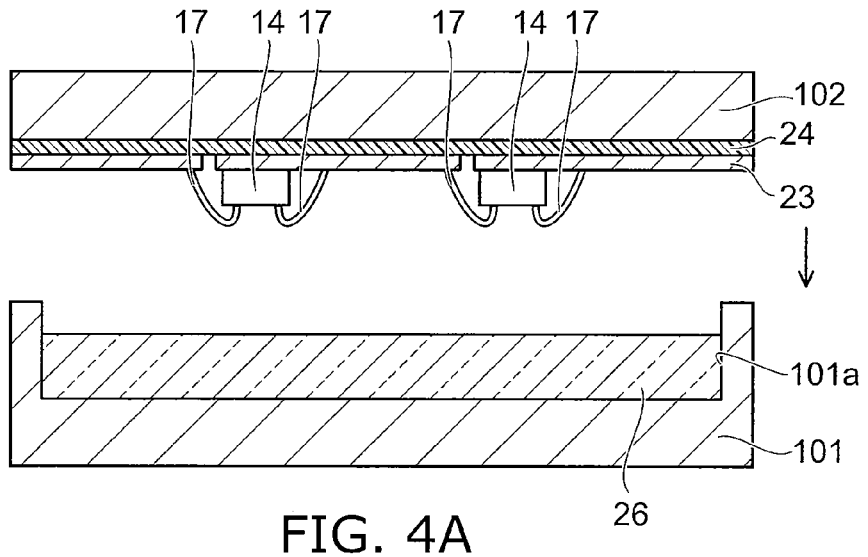
FIGS. 4A to 4C are sectional views schematically illustrating the process for vacuum molding.
Figure 4B:
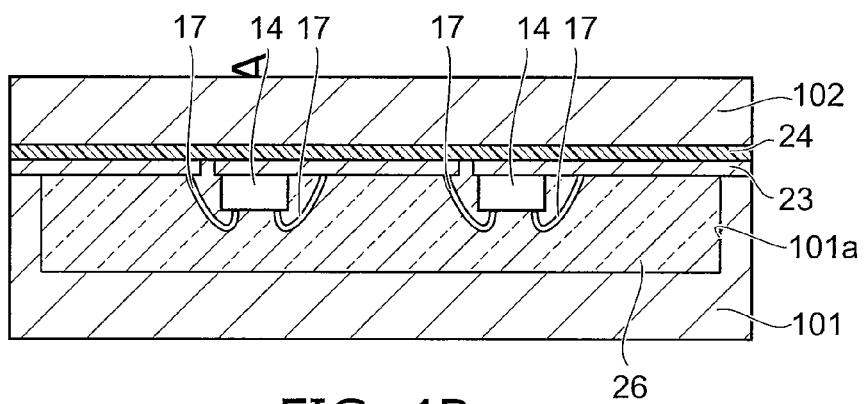
Figure 4C:
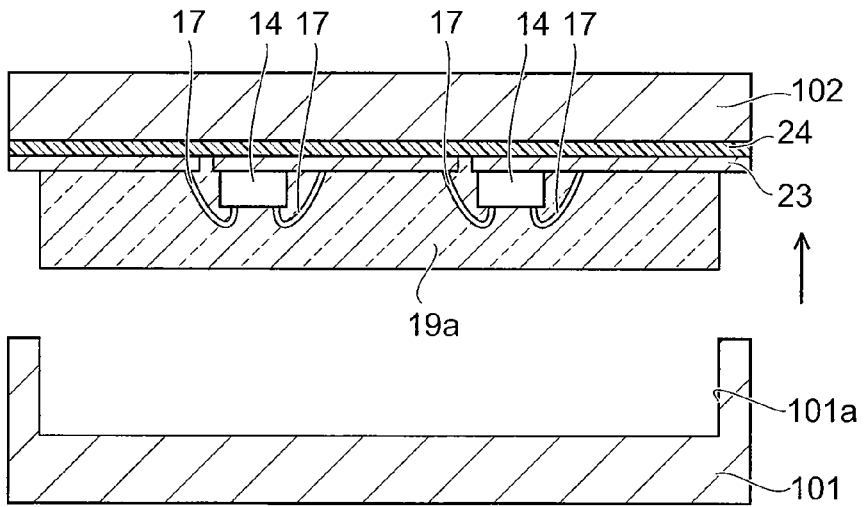

Next, as shown in FIG. 3B, an adhesive sheet 39 is affixed to the upper surface of the second resin 19b. The adhesive sheet 39 used has higher adhesiveness than the sacrificial sheet 27. Then, by peeling the adhesive sheet affixed to the upper surface of the second resin 19b, the second resin 19b formed on the upper surface of the first resin 19a is removed together with the sacrificial sheet 27. Thus, as shown in FIG. 3C, a resin package 18 with the outer edge of the first resin 19a covered with the second resin 19b can be formed. The thickness of the second resin 19b can be adjusted by the thickness of the edge of the dicing blade used in the step shown in FIG. 2C.

Figure 3D:
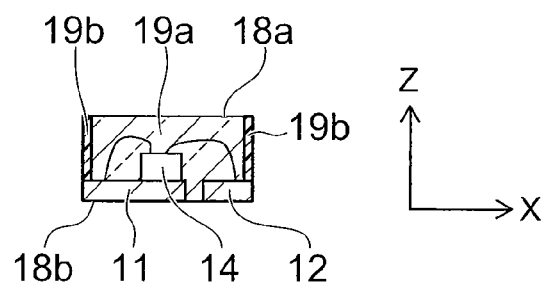

FIG. 3D shows a semiconductor light emitting device 1 detached from the dicing sheet 35. The semiconductor light emitting device 1 emits the light of the LED 14 in the Z direction shown in this figure. At one major surface 18b of the resin package 18 on the opposite side from the light emitting surface 18a, the back surface of the lead frame 11 and the back surface of the lead frame 12 are exposed. The back surface of the lead frames 11 and 12 is provided with e.g. an Ag plating surface compatible with the solder material used in bonding to a circuit substrate.

Furthermore, at a plurality of side surfaces crossing the major surface 18b, the end surface of the lead frame 11 and the end surface of the lead frame 12 are exposed. At each end surface cut by the dicing blade, the core material of the lead frames 11 and 12, such as copper (Cu), is exposed.

FIGS. 5A to 5D are sectional views schematically illustrating an alternative process for manufacturing the semiconductor light emitting device 1. The manufacturing method shown in these figures is different from the manufacturing method shown in FIGS. 2A to 3D in the process for removing the second resin 19b formed on the first resin 19a.

Figure 5A:
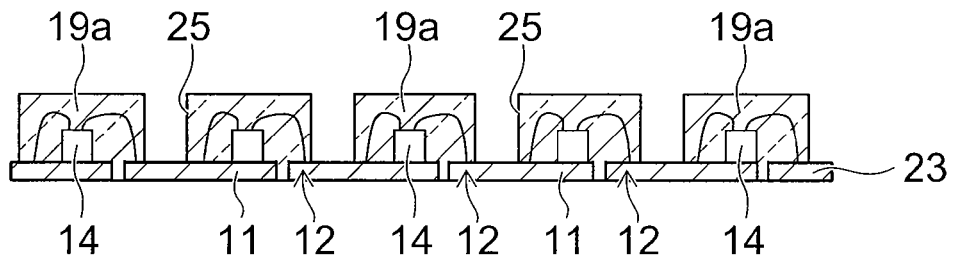
FIGS. 5A to 5D are sectional views schematically illustrating an alternative process for manufacturing the semiconductor light emitting device according to the first embodiment.
Figure 5B:
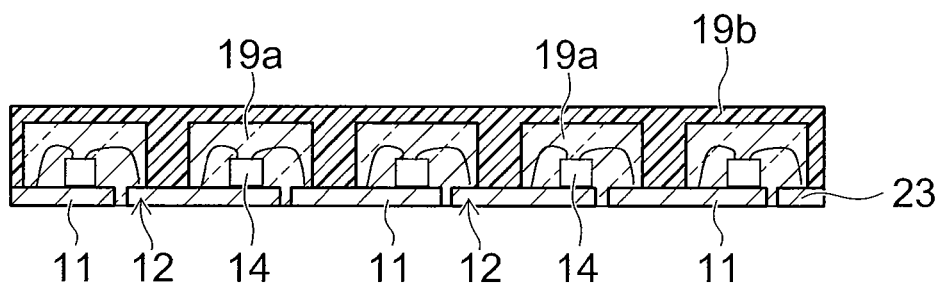

As shown in FIG. 5A, in this embodiment, dicing is performed to form a groove 25 without affixing a sacrificial sheet 27 to the front surface of the first resin 19a. Subsequently, as shown in FIG. 5B, a second resin 19b is molded on the first resin 19a and filled in the groove 25.

Figure 5C:
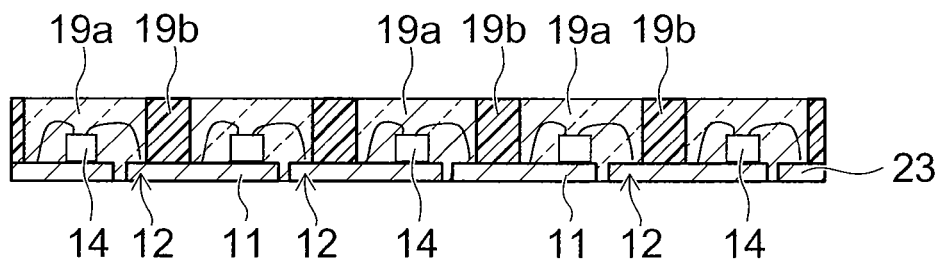
Figure 5D:
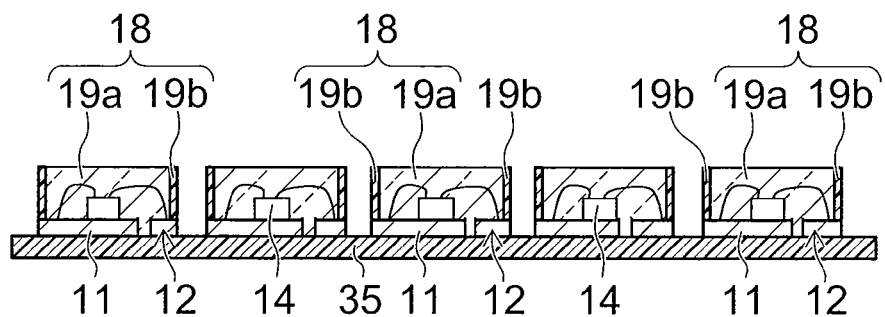

Next, the front surface of the second resin 19b is polished or ground to expose the front surface of the first resin 19a as shown in FIG. 5C. Subsequently, along the extending direction of the groove 25, the second resin 19b and the metal plate 23 are cut. Thus, as shown in FIG. 5D, a resin package 18 with the outer edge of the first resin 19a covered with the second resin 19b can be formed.

Figure 6A:
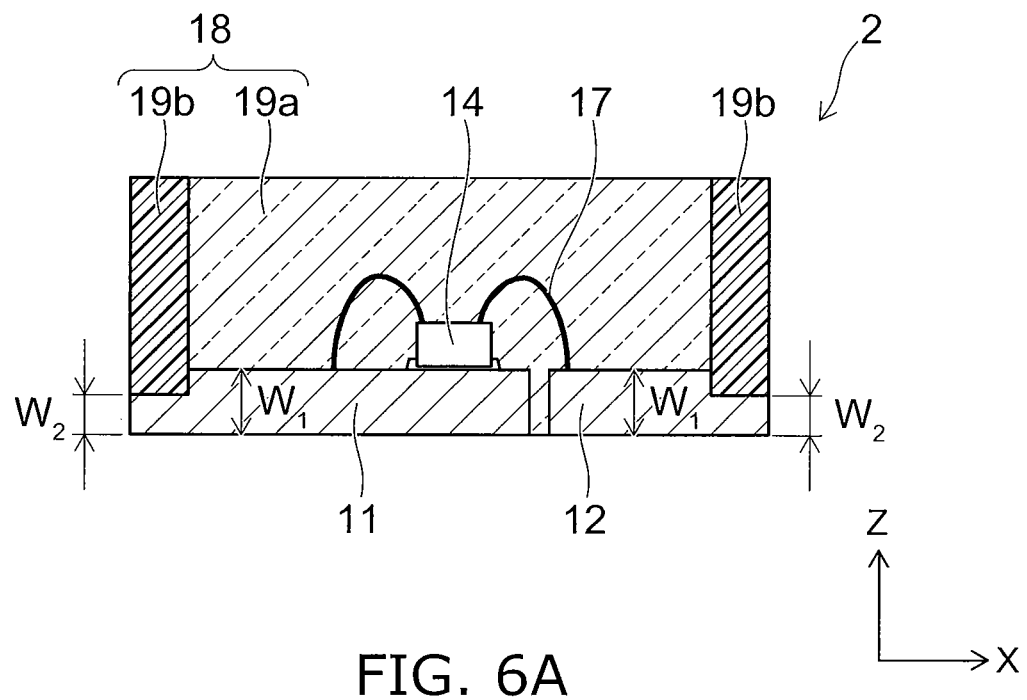
FIGS. 6A and 6B are sectional views schematically illustrating semiconductor light emitting devices according to variations of the first embodiment.
Figure 6B:
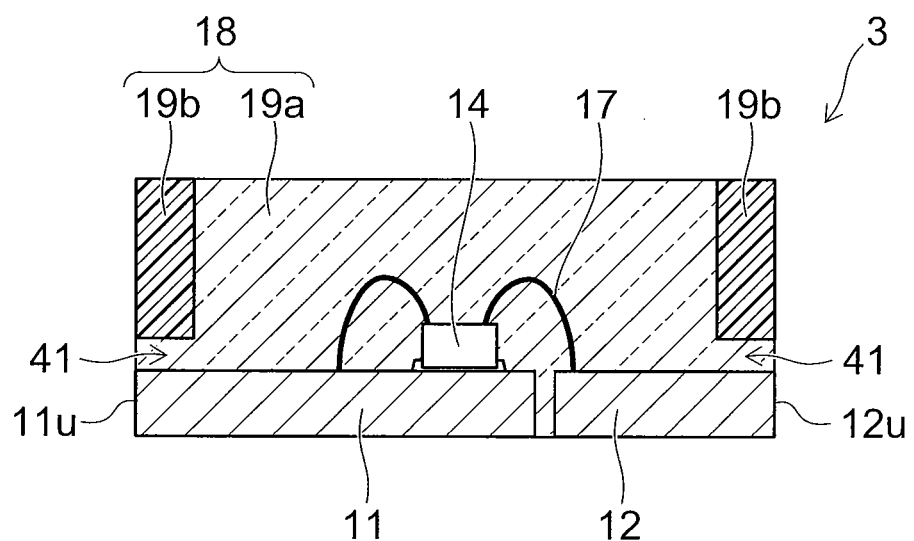

FIGS. 6A and 6B are sectional views schematically illustrating semiconductor light emitting devices 2 and 3 according to variations of the first embodiment.

In the semiconductor light emitting device 2 shown in FIG. 6A, the thickness $W_2$ of the end portion of the lead frames 11 and 12 at the outer edge of the resin package 18 is thinner than the thickness $W_1$ of the portion of the lead frame 11 where the light emitting element 14 is bonded, and the thickness $W_1$ of the portion of the lead frame 12 where the metal wire 17 is bonded. Such a structure can be formed by e.g. half-cutting the lead frames 11 and 12 in the step for forming the groove 25 shown in FIG. 2C.

For instance, when the semiconductor light emitting device 2 is bonded to a circuit substrate, the back surface of the lead frames 11 and 12 is soldered to the land pattern of the circuit substrate. At this time, the solder material is not only spread on the back surface of the lead frames 11 and 12, but also creeps up along the end surfaces 11$u$ and 12$u$. Thus, the end portion of the lead frames 11 and 12 is thinned to provide a step difference. This suppresses entry of solder creeping up along the end surfaces 11$u$ and 12$u$ beyond the step difference.

In the semiconductor light emitting device 3 shown in FIG. 6B, the first resin 19$a$ is interposed between the second resin 19$b$ covering the outer edge of the first resin 19$a$ and the lead frames 11 and 12. For instance, in the step shown in FIG. 2C, the dicing depth is set to be shallow. Thus, a portion 41 of the first resin 19$a$ can be left between the second resin 19$b$ and the lead frames 11 and 12.

To prevent entry of solder creeping up along the end surface of the lead frames 11 and 12, the degree of contact between the resin package 18 and the lead frames 11 and 12 is preferably high. That is, the semiconductor light emitting device 3 is advantageous in the case where the degree of contact between the first resin 19$a$ and the lead frames 11 and 12 is higher than the degree of contact between the second resin 19$b$ and the lead frames 11 and 12. Then, entry of solder can be suppressed.

As described above, the method for manufacturing a semiconductor light emitting device according to this embodiment can easily form a resin package 18 including a first resin 19$a$ and a second resin 19$b$ covering the outer edge of the first resin 19$a$. The light distribution characteristics can be controlled by changing the thickness of the second resin 19$b$ and the amount of reflective material dispersed in the second resin. Thus, this embodiment can provide a semiconductor light emitting device capable of realizing light distribution control at low cost and adaptable to widespread application.

(Second Embodiment)

Figure 7A:
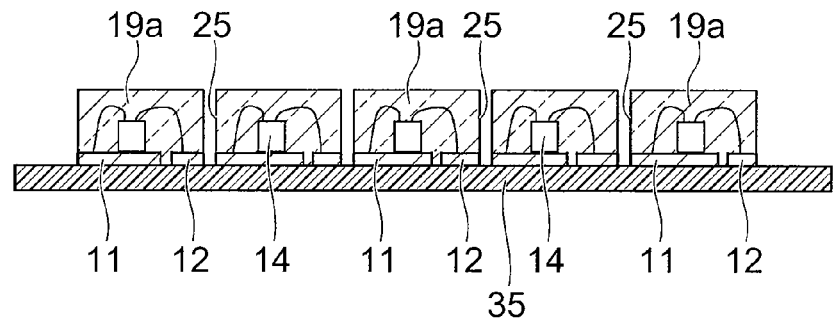
FIGS. 7A to 7C are sectional views schematically illustrating a process for manufacturing a semiconductor light emitting device according to a second embodiment.
Figure 7B:
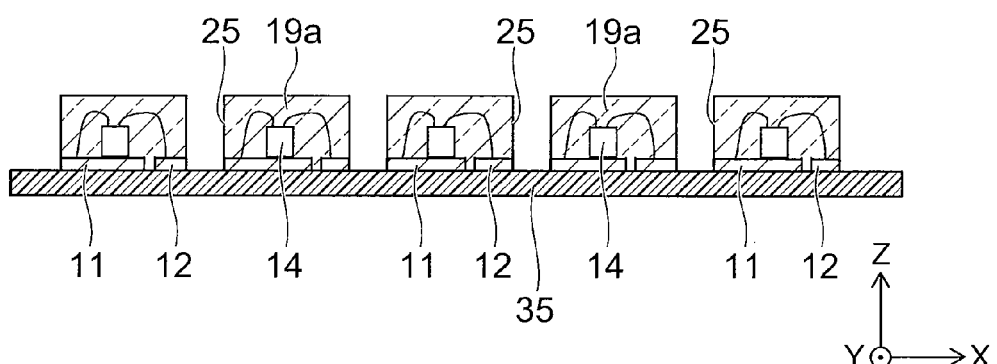
Figure 7C:
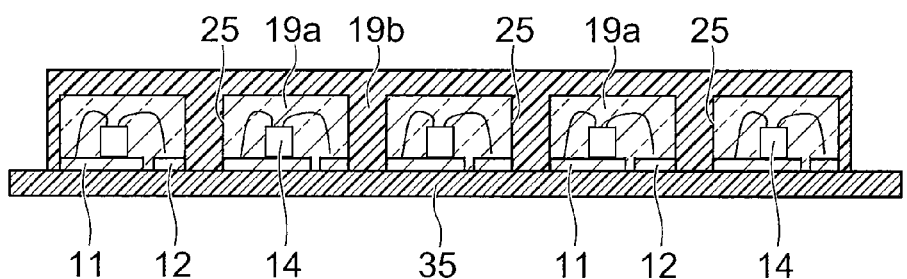
Figure 8A:
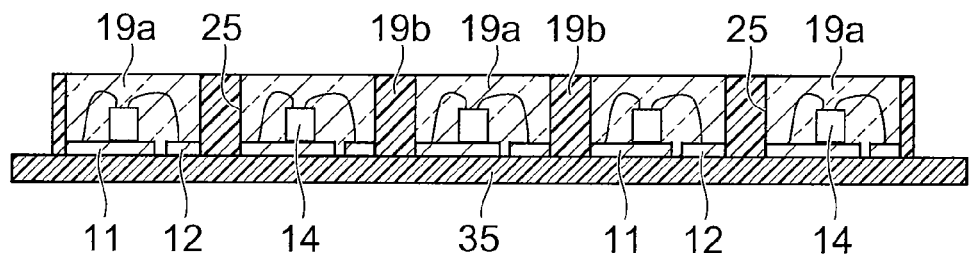
FIGS. 8A to 8C are sectional views schematically illustrating a process following FIGS. 7A to 7C.
Figure 8B:
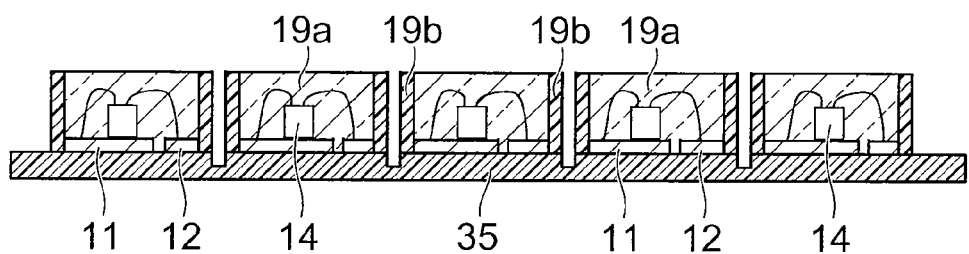
Figure 8C:
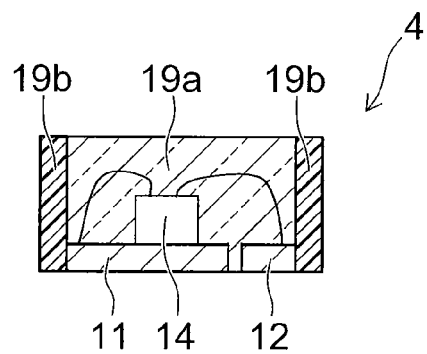

FIGS. 7A to 8C are sectional views schematically illustrating a process for manufacturing a semiconductor light emitting device 4 according to a second embodiment. As shown in FIG. 8C, the semiconductor light emitting device 4 according to this embodiment is different from the semiconductor light emitting devices 1-3 according to the first embodiment in that the outer edge of the first resin 19$a$ and the end surface of the lead frames 11 and 12 are covered with the second resin 19$b$.

In the manufacturing method according to this embodiment, the metal plate 23 with the first resin 19$a$ formed thereon is affixed to e.g. a dicing sheet 35. Then, as shown in FIG. 7A, a dicing blade is used to cut from the front surface of the first resin 19$a$ to the depth reaching the dicing sheet 35. Thus, a groove 25 is formed. Subsequently, as shown in FIG. 7B, the dicing sheet 35 is expanded in the X and Y direction to widen the width of the groove 25.

Next, as shown in FIG. 7C, for instance, by using the vacuum molding method, a second resin 19$b$ covering the surface of the first resin 19$a$ is formed. Subsequently, as shown in FIG. 8A, the upper surface of the second resin 19$b$ is polished or ground to expose the first resin 19$a$.

Next, as shown in FIG. 8B, the second resin 19$b$ is cut along the extending direction of the groove 25. Also in this case, the second resin 19$b$ filled inside the groove 25 is cut using a dicing blade thinner than the width of the groove 25.

FIG. 8C is a sectional view showing one semiconductor light emitting device 4 detached from the dicing sheet 35. As shown in this figure, in the semiconductor light emitting device 4, the second resin 19$b$ covers the outer edge of the first resin 19$a$ and the end surface of the lead frames 11 and 12. Only the back surface of the lead frames 11 and 12 is exposed at one major surface of the resin package 18. In other words, in plan view parallel to the major surface, the lead frames 11 and 12 are located inside the outer edge of the resin package 18.

In the manufacturing method according to this embodiment, the dicing sheet 35 is expanded in the X and Y directions. This can change the thickness of the second resin 19$b$ covering the outer edge of the first resin 19$a$. Thus, the light distribution characteristics can be varied. Furthermore, in the semiconductor light emitting device 4 manufactured by the manufacturing method according to this embodiment, the lead frame is not exposed at the side surface of the resin package 18. Thus, burrs and the like produced at the end surface of the lead frames 11 and 12 by dicing do not appear at the surface of the resin package 18. Hence, outline failure can be reduced. Furthermore, the end portion of the lead frames 11 and 12 is covered with the insulative resin. This can suppress migration of foreign matter by electric field to improve the reliability.

(Third Embodiment)

Figure 9:
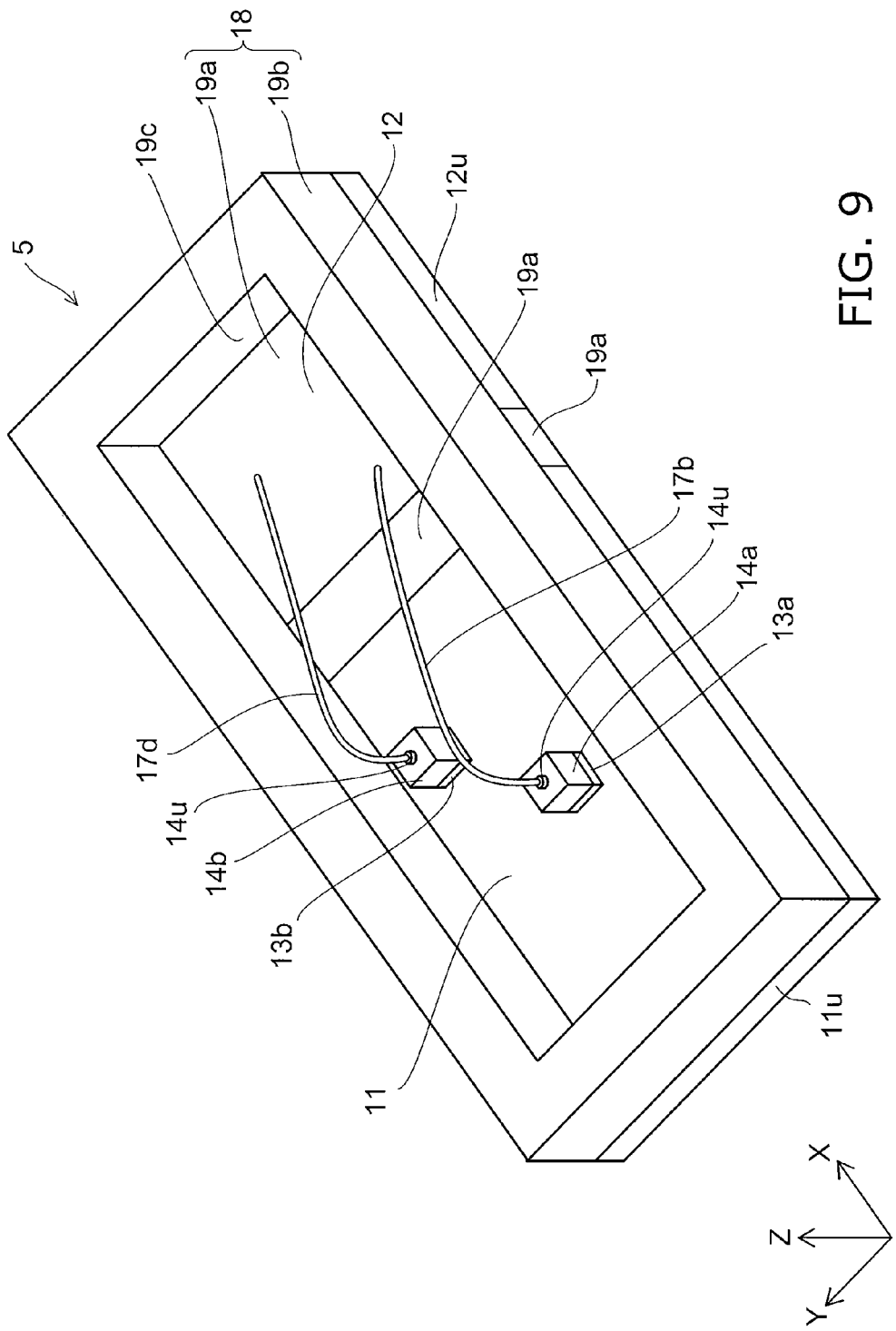
FIG. 9 is a perspective view illustrating a semiconductor light emitting device according to a third embodiment.

FIG. 9 is a perspective view illustrating a semiconductor light emitting device 5 according to a third embodiment. As shown in this figure, the semiconductor light emitting device 5 is different from the semiconductor light emitting devices 1-4 according to the above first embodiment in that the LED 14$a$ and 14$b$ has a vertically conducting structure.

More specifically, the LED 14$a$ and 14$b$ is provided with an upper surface electrode 14$u$ on the light emitting surface side and a back surface electrode (not shown). Thus, the metal wires 17$a$ and 17$c$ shown in FIG. 1 are not provided. In this case, the die mounting material 13$a$ and 13$b$ includes a conductive material. Furthermore, the front surface of the lead frame 11 is not provided with the groove 11$m$ for partitioning the bonding surface of the metal wires 17$a$ and 17$c$ from the application region of the die mounting material 13$a$ and 13$b$. The configuration, manufacturing method, and operation and effect of this embodiment other than the foregoing are similar to those of the above first embodiment.

(Fourth Embodiment)

Figure 10:
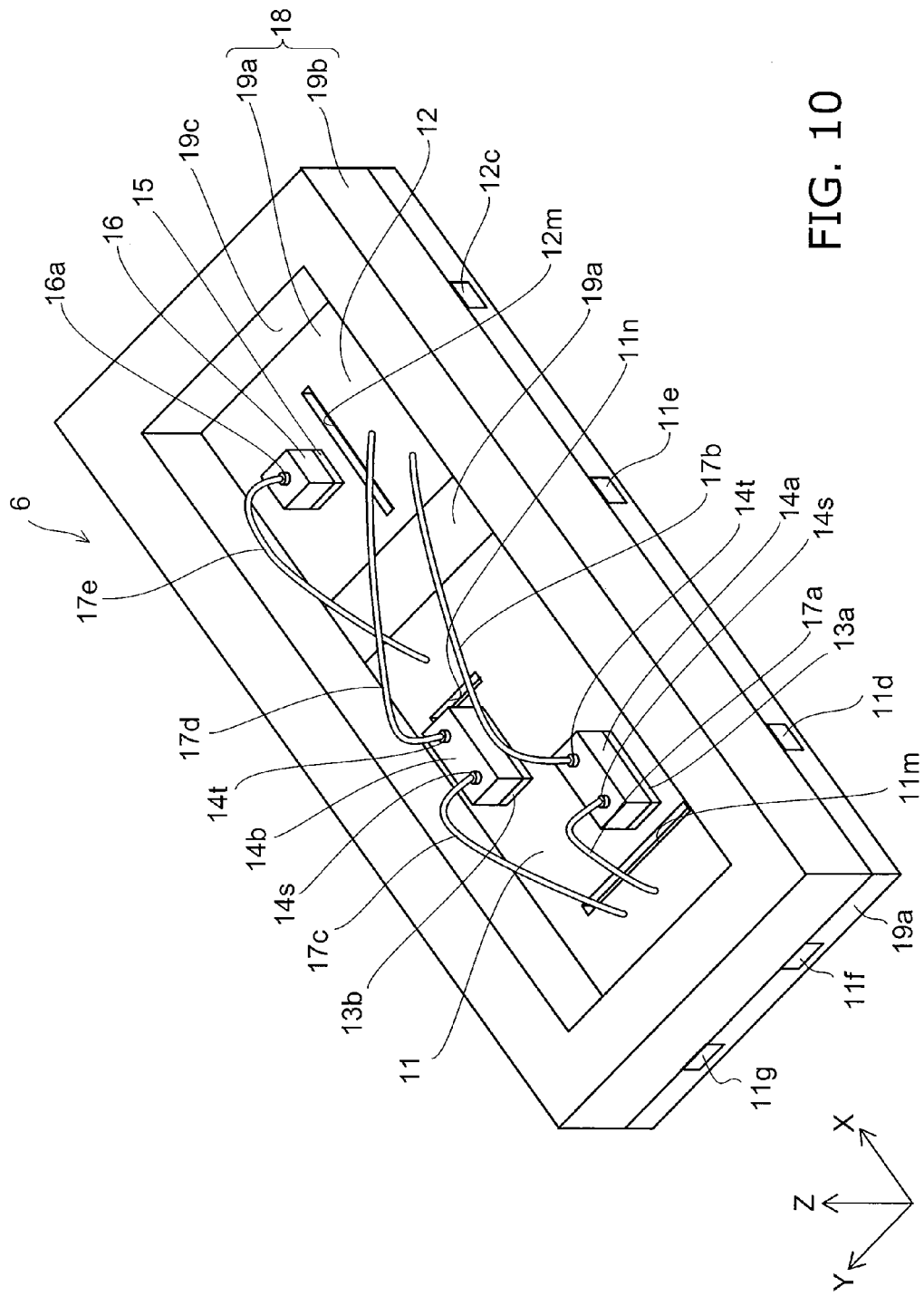
FIG. 10 is a perspective view illustrating a semiconductor light emitting device according to a fourth embodiment.

FIG. 10 is a perspective view illustrating a semiconductor light emitting device 6 according to a fourth embodiment. FIGS. 11A to 11D are schematic views illustrating the detailed structure of the semiconductor light emitting device 6.

The semiconductor light emitting device 6 is different from the semiconductor light emitting device 1 according to the above first embodiment in including a Zener diode 16 in addition to the configuration of the semiconductor light emitting device 1. The Zener diode 16 is provided to protect the LED 14$a$ and 14$b$ from voltage surge.

The Zener diode 16 is electrically connected to the lead frame 11 by a metal wire 17$e$. Thus, the lead frame 11 is provided with a groove 11$n$ for partitioning the bonding surface of the metal wire 17$e$ from the region where the die mounting material 13$a$ and 13$b$ for fixing the LED 14$a$ and 14$b$ is applied. Furthermore, the lead frame 12 is provided with a groove 12$m$ for partitioning the bonding surface of the metal wires 17$b$ and 17$d$ from the region where the die mounting material 15 for fixing the Zener diode 16 is applied.

Figures 11A, 11B, 11C, 11D:
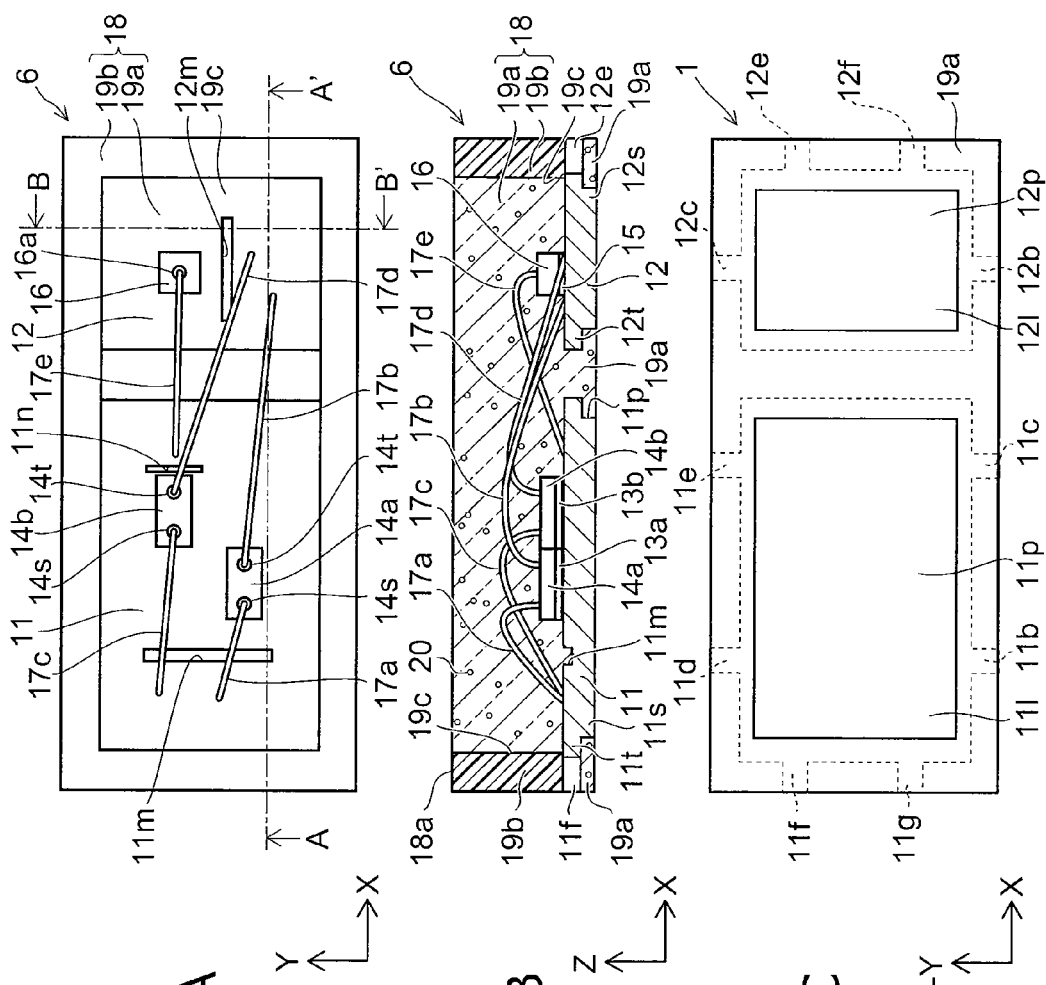
FIGS. 11A to 11D are schematic views illustrating the detailed structure of the semiconductor light emitting device according to the fourth embodiment.

FIG. 11A is a plan view of the semiconductor light emitting device 6 as viewed in the Z direction. FIG. 11B is a schematic view showing the structure in the A-A' cross section of FIG. 11A. FIG. 11D is a schematic view showing the structure in the B-B' cross section of FIG. 11A. FIG. 11C is a bottom view showing the back surface on the opposite side from the light emitting surface 18a.

As shown in FIGS. 11A, 11B, and 11D, the first resin 19a is formed so as to cover the LED 14a, 14b and metal wires 17a-17e and to cover the upper surface and side surface of the lead frames 11 and 12. Furthermore, a second resin 19b covering the outer edge (side surface) of the first resin 19a is provided. The first resin 19a transmits the light emitted by the LED 14a and 14b and the fluorescence emitted by the phosphor 20 (hereinafter collectively referred to as emission light). The first resin 19a is formed from e.g. transparent silicone resin. Here, "transparent" includes semi-transparent and translucent.

The transmittance for the emission light of the second resin 19b is lower than the transmittance of the first resin 19a. For instance, the second resin 19b is formed from white silicone resin. The reflectance for the emission light of the surface of the second resin 19b is higher than the reflectance for the emission light of the surface of the first resin 19a. Specifically, the first resin 19a is formed from e.g. dimethyl silicone resin. The second resin 19b is also formed from dimethyl silicone resin and contains a reflective material. The reflective material is made of e.g. fine powder composed primarily of titanium oxide. Thus, a reflectance of e.g. 80% or more can be realized in the visible light and near ultraviolet region (e.g., in the wavelength region of 800-350 nm).

Inside the first resin 19a, phosphor 20 can be dispersed. The phosphor 20 is particulate, absorbs the light emitted from the LED 14a and 14b, and emits fluorescence having longer wavelength than the absorbed light. For instance, phosphor 20 for absorbing part of the blue light emitted by the LED 14a and 14b and emitting yellow fluorescence is dispersed. Thus, the semiconductor light emitting device 6 emits white light in which the blue light emitted from the LED 14a and 14b and not absorbed by the phosphor 20 is mixed with the yellow fluorescence of the phosphor 20.

For convenience, in FIGS. 11B and 11D, the phosphor 20 is depicted with lower concentration and larger size than in reality. In the perspective view of FIG. 10 and the plan view of FIG. 11A, the phosphor 20 is not shown.

The phosphor 20 can be e.g. a silicate-based phosphor emitting yellow-green, yellow, or orange light. The silicate-based phosphor can be represented by the following general formula:

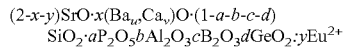

where $0<x$, $0.005<y<0.5$, $x+y\leq1.6$, $0\leq a$, b, c, $d<0.5$, $0<u$, $0<v$, and $u+v=1$.

Furthermore, a YAG-based phosphor can also be used as a yellow phosphor. The YAG-based phosphor can be represented by the following general formula:

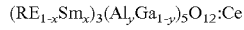

where $0\leq x<1$, $0\leq y\leq1$, and RE is at least one element selected from Y and Gd.

The phosphor 20 can be a mixture of a sialon-based red phosphor and green phosphor. That is, the phosphor 20 can include a green phosphor absorbing blue light emitted from the LED 14a and 14b and emitting green light, and a red phosphor absorbing blue light and emitting red light.

The sialon-based red phosphor can be represented by e.g. the following general formula:

where M is at least one metallic element except Si and Al, and preferably at least one of Ca and Sr in particular. R is an emission center element, and preferably Eu. The quantities x, a1, b1, c1, and d1 satisfy $0<x\leq1$, $0.6<a1<0.95$, $2<b1<3.9$, $0.25<c1<0.45$, and $4<d1<5.7$. A specific example of such a sialon-based red phosphor is given by:

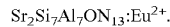

The sialon-based green phosphor can be represented by e.g. the following general formula:

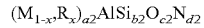

where M is at least one metallic element except Si and Al, and preferably at least one of Ca and Sr. R is an emission center element, and preferably Eu. The quantities x, a2, b2, c2, and d2 satisfy $0<x\leq1$, $0.93<a2<1.3$, $4.0<b2<5.8$, $0.6<c2<1$, and $6<d2<11$. A specific example of such a sialon-based green phosphor is given by:

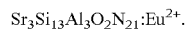

Next, the lead frame according to this embodiment is described. The lead frames 11 and 12 include a protrusion 11p and a protrusion 12p on the back surface side (see FIGS. 12A to 12C). At the outer periphery of the protrusion 11p, the lead frame 11 includes a thin plate portion 11t and suspension pins 11b-11g extending out around the thin plate portion 11t. Likewise, at the outer periphery of the protrusion 12p, the lead frame 12 includes a thin plate portion 12t and suspension pins 12b-12f extending out around the thin plate portion 12t.

As shown in FIG. 11C, in the back surface 11l of the lead frame 11, the surface of the protrusion 11p is exposed at the back surface of the resin package 18. The tip surface of the suspension pins 11b-11g is exposed at the side surface of the resin package 18 (see FIG. 10). On the other hand, in the lead frame 11, the entire upper surface 11h, the portion of the back surface 11l other than the protrusion 11p, i.e., the back surface of each suspension pin and the thin plate portion 11t, and the portion of the side surface other than the tip surface of the suspension pins, i.e., the side surface of the protrusion 11p, the end surface of the base portion 11a, and the side surface of the suspension pins are covered with the resin package 18 (first resin 19a). This strengthens the contact between the lead frame 11 and the first resin 19a.

Likewise, the surface of the protrusion 12p of the lead frame 12 is exposed at the back surface of the resin package 18. The tip surface of the suspension pins 12b-12f is exposed at the side surface of the resin package 18. On the other hand, in the lead frame 12, the entire upper surface 12h, the portion of the back surface 12l other than the protrusion 12p, i.e., the back surface of each suspension pin and the thin plate portion 12t, and the portion of the side surface other than the tip surface of the suspension pins, i.e., the side surface of the protrusion 12p, the end surface of the base portion 12a, and the side surface of the suspension pins are covered with the resin package 18 (first resin 19a). This also strengthens the contact between the lead frame 12 and the first resin 19a.

The resin package 18 is shaped like e.g. a rectangle as viewed in the Z direction. The surface of the protrusions 11p and 12p is exposed at the back surface of the resin package 18 and serves as an electrode pad. The tip surfaces of the plurality of suspension pins provided in the respective lead frames 11 and 12 are exposed at three different side surfaces of the resin package 18.

FIGS. 12A to 12C illustrate the lead frames of the semiconductor light emitting device 6. As shown in FIG. 12A, the lead frame 11 includes a base portion 11a shaped like a rectangle as viewed in the Z direction. From this base portion 11a, six suspension pins 11b, 11c, 11d, 11e, 11f, 11g extend out.

The suspension pins 11b and 11c extend out from one edge 11x of the base portion 11a to the Y direction. The suspension pins 11d and 11e extend out from the edge opposite to the edge 11x toward the −Y direction. In the X direction, the positions of the suspension pins 11b and 11d are the same, and the positions of the suspension pins 11c and 11e are the same. The suspension pins 11f and 11g extend out from the edge 11y of the base portion 11a toward the −X direction. Thus, the suspension pins 11b-11g extend out from three different sides (three edges) of the base portion 11a.

On the other hand, as compared with the lead frame 11, the lead frame 12 has a shorter length in the X direction and the same length in the Y direction. The lead frame 12 includes a base portion 12a shaped like a rectangle as viewed in the Z direction. From the edges of this base portion 12a, four suspension pins 12b-12f extend out. The suspension pin 12b extends out from the center of the edge 12x of the base portion 12a toward the Y direction. The suspension pin 12c extends out from the center of the edge opposite to the edge 12x toward the −Y direction. The suspension pins 12d and 12e extend out from the edge 12y of the base portion 12a toward the X direction. Thus, the suspension pins 12b-12e extend out from three different sides of the base portion 12a.

The width of the suspension pins 11g and 11f of the lead frame 11 may be either equal to or different from the width of the suspension pins 12d and 12e of the lead frame 12. However, if the width of the suspension pins 11d and 11e is made different from the width of the suspension pins 12d and 12e, it is easier to distinguish between the anode and the cathode.

As shown in FIGS. 12A and 12B, a protrusion 11p is formed at the center of the base portion 11a on the back surface 11l of the lead frame 11. Thus, the lead frame 11 has two thickness levels. That is, the center of the base portion 11a, i.e., of the portion where the protrusion 11p is formed, constitutes a thick plate portion 11s being relatively thick. On the other hand, the outer peripheral portion and the suspension pins 11b-11g of the base portion 11a constitute a thin plate portion 11t being relatively thin.

As shown in FIGS. 12B and 12C, a protrusion 12p is formed at the center of the base portion 12a on the back surface 12l of the lead frame 12. Thus, the lead frame 12 also has two thickness levels. That is, the center of the base portion 12a constitutes a thick plate portion 12s being relatively thick, because the protrusion 12p is formed. On the other hand, the outer peripheral portion and the suspension pins 12b-12e of the base portion 12a constitute a thin plate portion 12t being relatively thin. In other words, a notch is formed at the lower surface of the outer peripheral portion of the base portions 11a and 12a.

Thus, the protrusions 11p and 12p are formed in regions spaced from the mutually opposed edges of the lead frames 11 and 12. The regions including these edges constitute the thin plate portions 11t and 12t. The upper surface 11h of the lead frame 11 and the upper surface 12h of the lead frame 12 are flush with each other. The lower surface of the protrusion 11p of the lead frame 11 and the lower surface of the protrusion 12p of the lead frame 12 are flush with each other. The position of the upper surface of each suspension pin in the Z direction coincides with the position of the upper surface of the lead frames 11 and 12. Hence, the suspension pins are located on the same XY plane.

In the region on the edge 11y side of the upper surface 11h of the lead frame 11, a groove 11m extending in the Y direction is formed. In the region of the upper surface 11h displaced from the center toward the X and Y directions, a groove 11n extending in the Y direction is formed. Furthermore, at the center of the upper surface 12h of the lead frame 12, a groove 12m extending in the X direction is formed. The grooves 11m, 11n, and 12m are all formed in the thick plate portion 11s or 12s, i.e., inside the immediately overlying region of the protrusion 11p or 12p. The grooves 11m, 11n, and 12m do not reach the outer edge of the thick plate portion, and do not penetrate through the lead frame also in the Z direction.

Figure 13A:
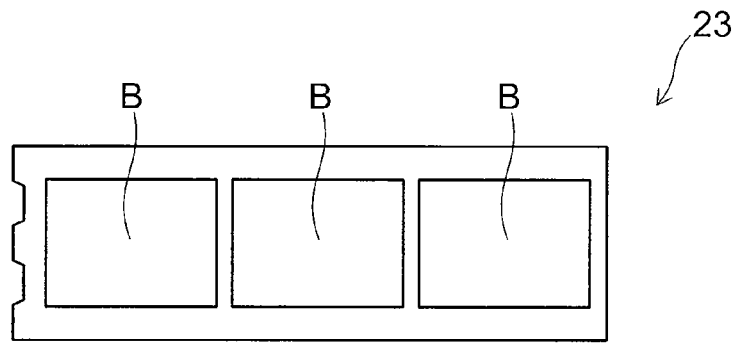
FIG. 13A is a plan view illustrating the metal plate in the fourth embodiment.
Figure 13B:
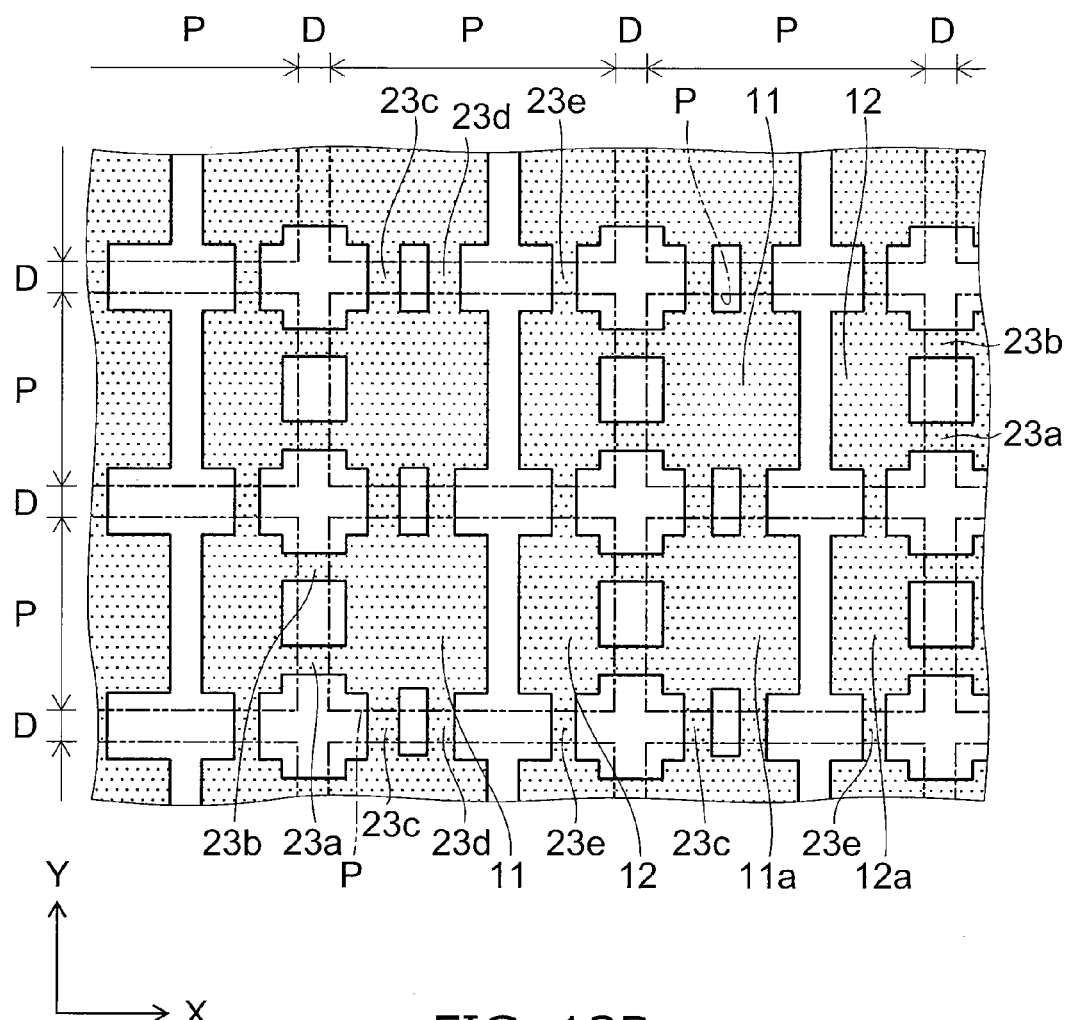
FIG. 13B is a partially enlarged plan view of the metal plate.

FIG. 13A is a plan view illustrating the metal plate 23 in the fourth embodiment. FIG. 13B is a partially enlarged plan view of this metal plate 23.

As shown in FIG. 13A, in the metal plate 23, for instance, three blocks B are defined. In each block B, for instance, approximately 1000 pair frames P are formed. As shown in FIG. 13B, the pair frames P are arranged in a matrix. The portion between the adjacent pair frames P constitutes a lattice-like dicing region D. Such a frame pattern can be manufactured by e.g. selectively etching the metal plate 23.

Each pair frame P includes lead frames 11 and 12 spaced from each other. More specifically, a basic pattern with a plurality of lead frames 11 and a plurality of lead frames 12 alternately arranged in the X direction is formed. In the dicing region D, the adjacent pair frames P are connected by a connecting portion (suspension pin).

The lead frame 11 and the lead frame 12 are spaced from each other. The lead frame 11 included in one pair frame P is connected via connecting portions 23a and 23b to the lead frame 12 of the adjacent pair frame P located on the −X-direction side of the former pair frame P. On the other hand, in the Y direction, the lead frames 11 included in the adjacent pair frames P are connected to each other via connecting portions 23c and 23d. Likewise, in the Y direction, the lead frames 12 included in the adjacent pair frames P are connected to each other via a connecting portion 23e.

Thus, from the base portions 11a and 12a spaced inward from the outer edge of the pair frame P, the connecting portions 23a-23e extending through the dicing region D to the adjacent pair frame P are provided toward three directions. Furthermore, by half-etching the metal plate 23 from its lower surface side, protrusions 11p and 12p are formed on the lower surface of the lead frames 11 and 12, respectively (see FIGS. 12A to 12C).

Here, it is understood that the metal plate 23 and the phosphor 20 described in detail in this embodiment are also applicable to the other embodiments.

(Fifth Embodiment)

Figure 14:
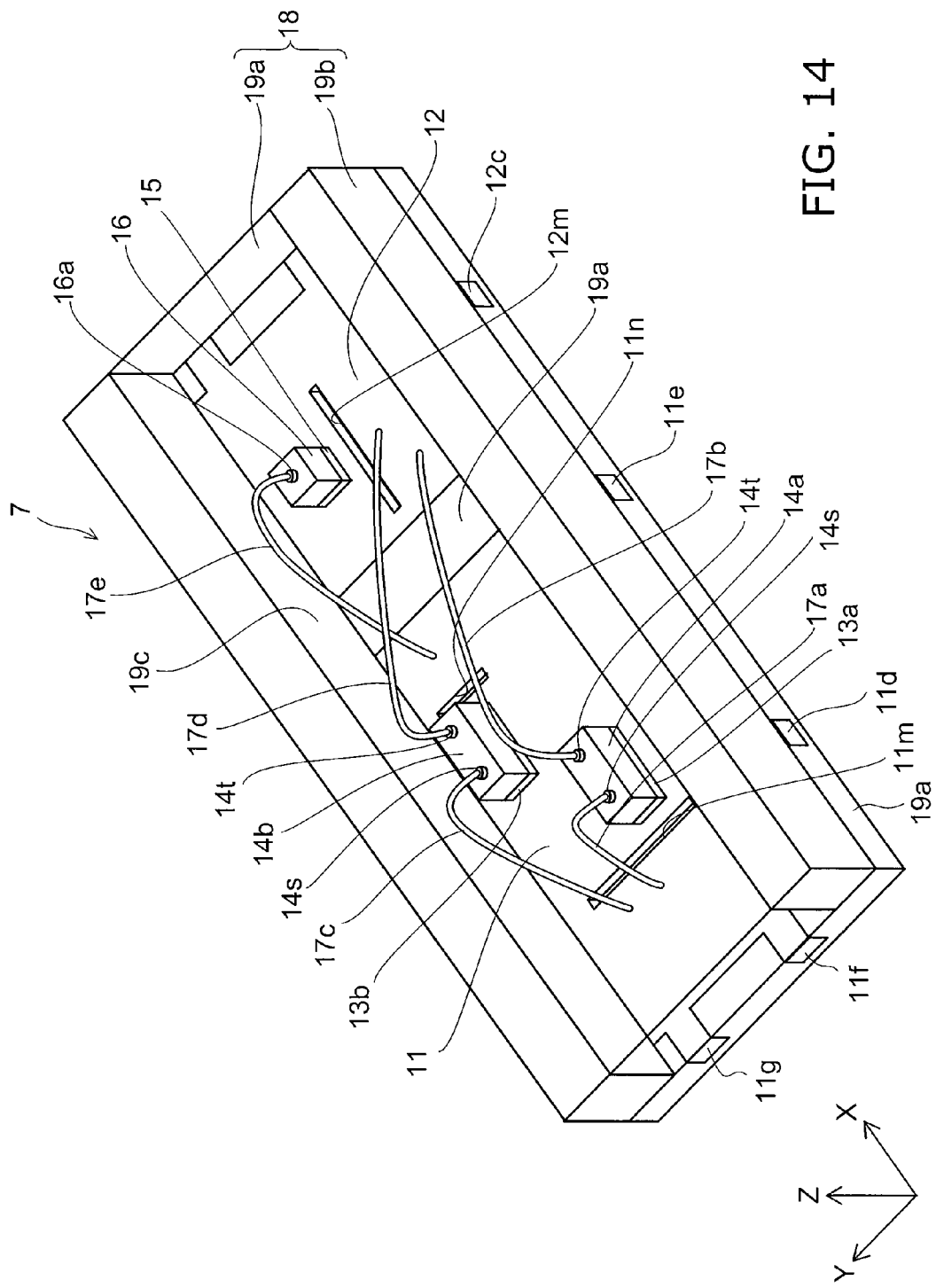
FIG. 14 is a perspective view illustrating a semiconductor light emitting device according to a fifth embodiment.

FIG. 14 is a perspective view illustrating a semiconductor light emitting device 7 according to a fifth embodiment. As shown in this figure, the semiconductor light emitting device 7 is different from the semiconductor light emitting device 6 (see FIGS. 13A and 13B) according to the above fourth embodiment in the arrangement of the first resin 19a and the second resin 19b in the resin package 18.

In this embodiment, the second resin 19b extends only in the X direction (longitudinal direction) of the resin package 18, and not provided in the Y direction (lateral direction). That is, the second resin 19b is provided not like a frame surrounding the outer edge of the first resin 19a, but like two stripes extending in the X direction and sandwiching the first resin 19a in the Y direction. The second resin 19b is provided over the entire X-direction length of the resin package 18. The lowermost portion of the resin package 18, i.e., the portion located below the upper surface of the lead frames 11 and 12, is filled with the first resin 19a.

Such a resin package 18 can be formed by e.g. dicing the first resin only in the X direction in the step for forming the groove 25 shown in FIG. 2C or FIG. 5A. In the semiconductor light emitting device 7, the directivity in the Y direction is high. In the X direction, light is emitted with a wide emission angle. The configuration, manufacturing method, and operation and effect of this embodiment other than the foregoing are the same as those of the semiconductor light emitting device 6 according to the fourth embodiment.

(Sixth Embodiment)

Figure 15:
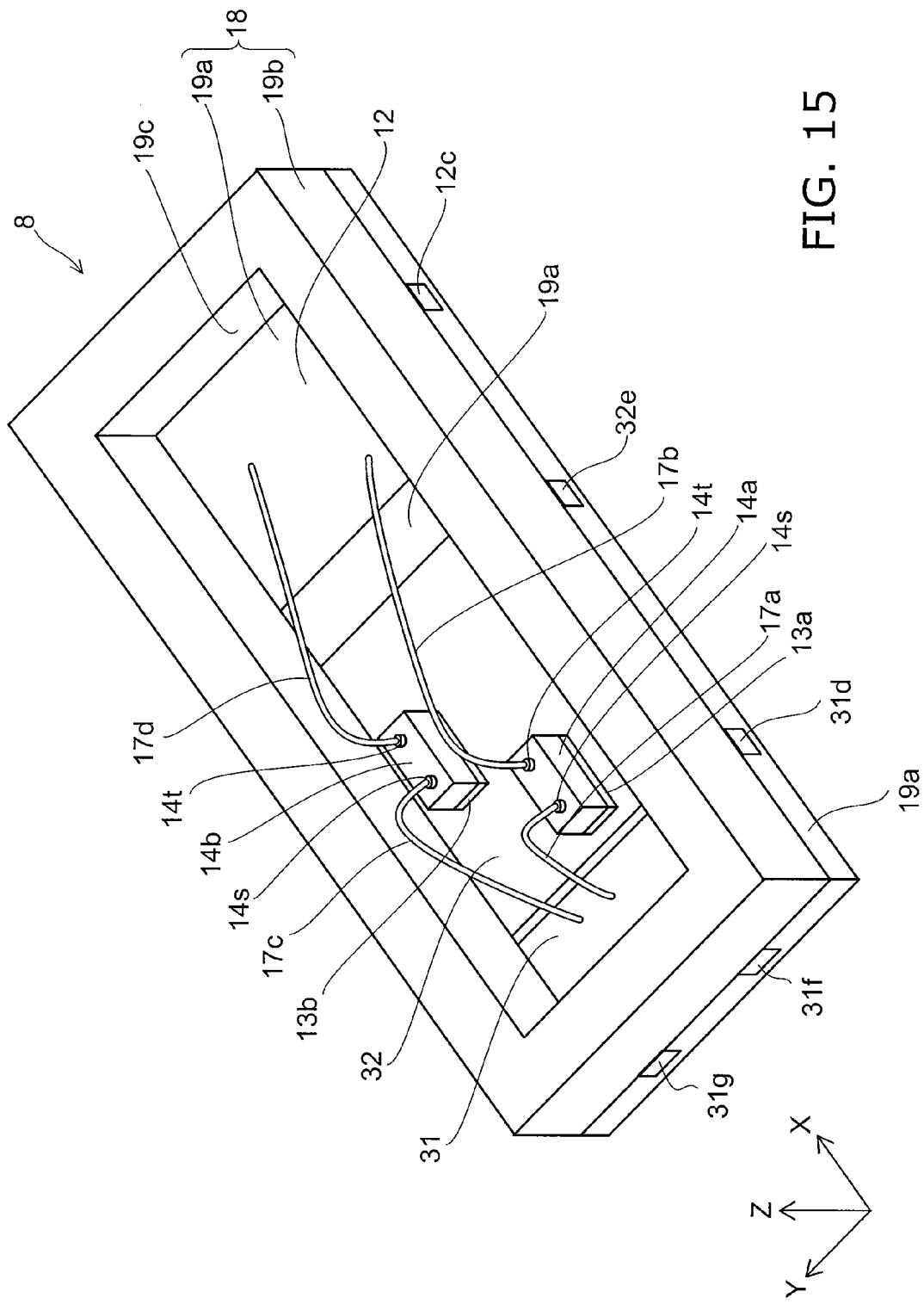
FIG. 15 is a perspective view illustrating a semiconductor light emitting device according to a sixth embodiment.

FIGS. 15 to 17C are schematic views illustrating a semiconductor light emitting device 8 according to a sixth embodiment. FIG. 15 is a perspective view showing the semiconductor light emitting device 8. FIGS. 16A to 16D are schematic views illustrating the detailed structure of the semiconductor light emitting device 8. FIG. 16A is a plan view as viewed in the Z direction. FIG. 16B shows the structure in the A-A' cross section shown in FIG. 16A. FIG. 16C is a bottom view. FIG. 16D shows the structure in the B-B' cross section shown in FIG. 16A. FIGS. 17A to 17C are schematic views illustrating the lead frames of the semiconductor light emitting device 8. FIG. 17A is a top view. FIG. 17B is a sectional view taken along line C-C' shown in FIG. 17A. FIG. 17C is a sectional view taken along line D-D' shown in FIG. 17A.

The semiconductor light emitting device 8 is different from the semiconductor light emitting device 6 (see FIGS. 10 to 12C) according to the above fourth embodiment in that the lead frame 11 is divided into two lead frames 31 and 32 in the X direction. The lead frame 32 is located between the lead frame 31 and the lead frame 12.

As shown in FIGS. 17A to 17C, in this embodiment, the base portion 11a (see FIGS. 12A to 12C) of the lead frame 11 in the semiconductor light emitting device 6 according to the above fourth embodiment corresponds to the base portions 31a and 32a of the lead frames 31 and 32. The suspension pins 11b-11g of the lead frame 11 correspond to the suspension pins 31b, 32c, 31d, 32e, 31f, and 31g of the lead frames 31 and 32. Furthermore, the protrusion 11p of the lead frame 11 is divided into the protrusion 31p of the lead frame 31 and the protrusion 32p of the lead frame 32. As viewed in the Z direction, the protrusions 31p and 32p are formed at the center of the base portions 31a and 32a, respectively.

As shown in FIGS. 15 and 16A, one end of the metal wires 17a and 17c is bonded to the upper surface of the lead frame 31. On the other hand, as in the above fourth embodiment, one end of the metal wires 17b and 17d is bonded to the lead frame 12. Furthermore, in this embodiment, the Zener diode 16 (see FIG. 10) is not placed, and the die mounting material 15 and the metal wire 17e are also not provided. Hence, the grooves 11m, 11n, and 12m are not formed.

In this embodiment, a driving current is externally supplied to the LED 14a and 14b via the lead frames 31 and 12. On the other hand, the lead frame 32 may be electrically neutral and functions as a heat sink. For instance, in the case where a plurality of semiconductor light emitting devices 8 are mounted on one circuit substrate, the lead frame 32 can be connected to a common heat sink to improve heat dissipation.

The lead frame 32 may be placed at either the ground potential or a floating potential. When the semiconductor light emitting device 8 is mounted on the circuit substrate, the so-called Manhattan phenomenon can be suppressed by bonding a solder ball to each of the lead frames 31, 32, and 12. The Manhattan phenomenon is a phenomenon in which, when a device is mounted on a circuit substrate via a plurality of solder balls and the like, the device rises up due to the surface tension of solder resulting from the different melting timing of the solder balls in the reflow process. This phenomenon causes mounting failure. According to this embodiment, the solder balls can be densely placed in the X direction to suppress the Manhattan phenomenon.

In this embodiment, the lead frame 31 is supported from three directions by the suspension pins 31b, 31d, 31f, 31g. Hence, bonding of the metal wires 17a and 17c is made easy. Likewise, the lead frame 12 is supported from three directions by the suspension pins 12b-12f. Hence, bonding of the metal wire 17 is also made easy.

The semiconductor light emitting device 8 according to this embodiment can be manufactured using the manufacturing method of the above first embodiment by varying the pattern of each pair frame P in the metal plate 23 shown in FIGS. 13A and 13B. The configuration, and operation and effect of this embodiment other than the foregoing are the same as those of the semiconductor light emitting device 6 according to the above fourth embodiment.

(Seventh Embodiment)

Figure 18:
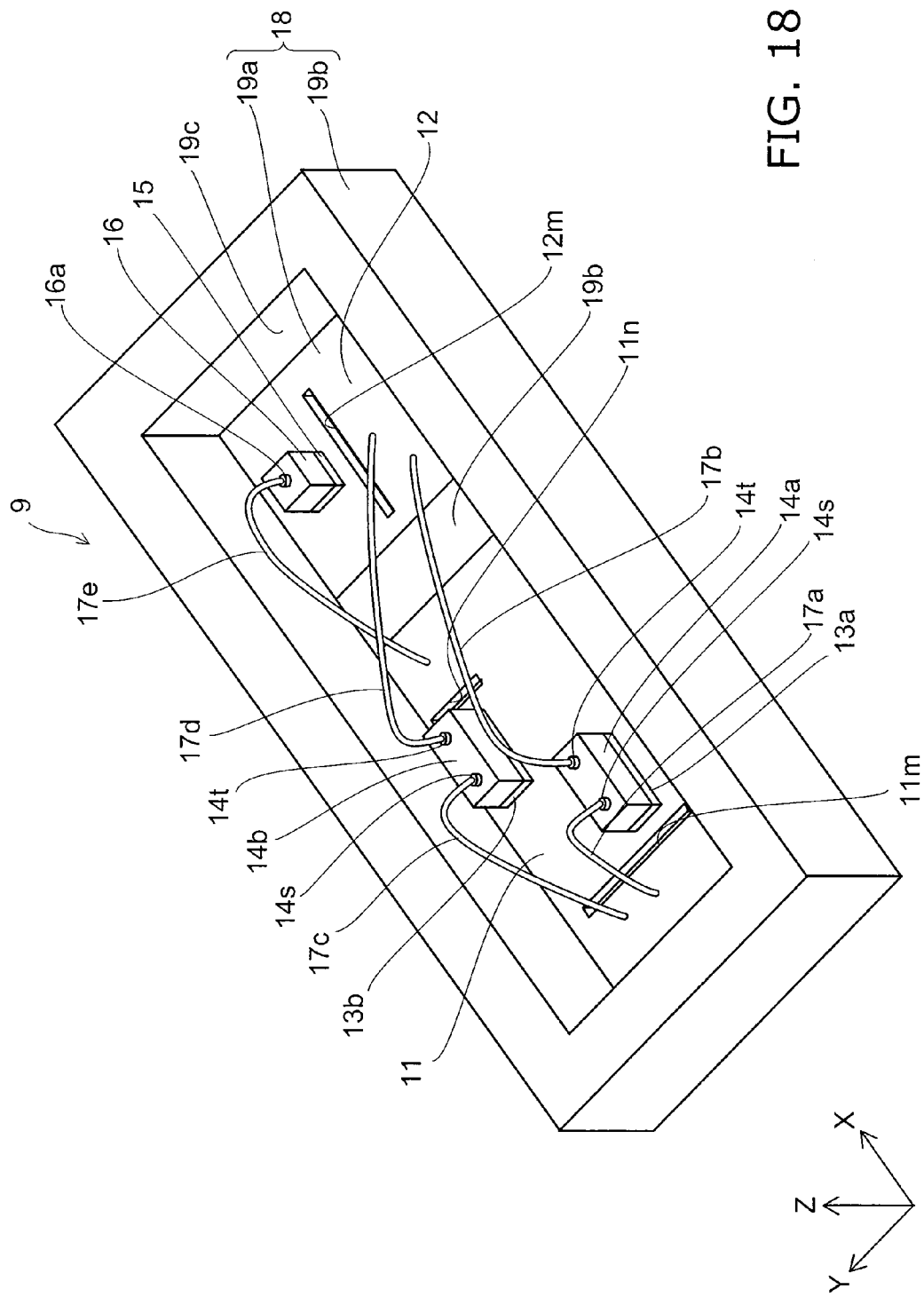
FIG. 18 is a perspective view illustrating a semiconductor light emitting device according to a seventh embodiment.

FIG. 18 is a perspective view illustrating a semiconductor light emitting device 9 according to a seventh embodiment. FIGS. 19A to 19C are schematic views illustrating the detailed structure of the semiconductor light emitting device 9. FIG. 19A is a plan view as viewed in the Z direction. FIG. 19B shows the structure in the A-A' cross section shown in FIG. 19A. FIG. 19C shows the structure in the B-B' cross section shown in FIG. 19A.

The semiconductor light emitting device 9 is different from the semiconductor light emitting device 6 (see FIGS. 10 to 12C) according to the above fourth embodiment in the shape of the second resin 19b covering the outer edge of the first resin 19a. Furthermore, there is a difference in that the end surface of the lead frames 11 and 12 is not exposed at the side surface of the resin package 18.

As shown in FIGS. 19B and 19C, the second resin 19b according to this embodiment is provided so that its width in the X and Y directions is narrowed in the Z direction. That is, the inner surface 19c surrounding the first resin 19a is provided in a shape opening in the Z direction. Thus, the light emitted from the LED 14a and 14b can be reflected in the Z direction to enhance the directivity in the Z direction.

FIGS. 20A to 21C are sectional views schematically illustrating a process for manufacturing the semiconductor light emitting device 9. This embodiment is different from the manufacturing method (see FIGS. 5A to 5D) according to the first embodiment in that dicing is performed from the back surface side of the metal plate 23 to form a groove to be filled with the second resin 19b.

Figure 20A:
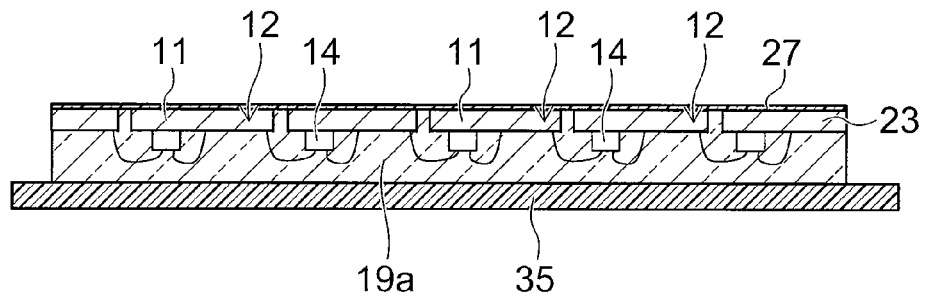
FIGS. 20A to 20C are sectional views schematically illustrating a process for manufacturing a semiconductor light emitting device according to the seventh embodiment.

First, as shown in FIG. 20A, the metal plate 23 with the first resin 19a formed thereon is affixed to a dicing sheet 35. As shown in this figure, the upper surface of the first resin 19a is bonded to the dicing sheet 35. Furthermore, a sacrificial sheet 27 is affixed to the back surface of the metal plate 23.

Figure 20B:
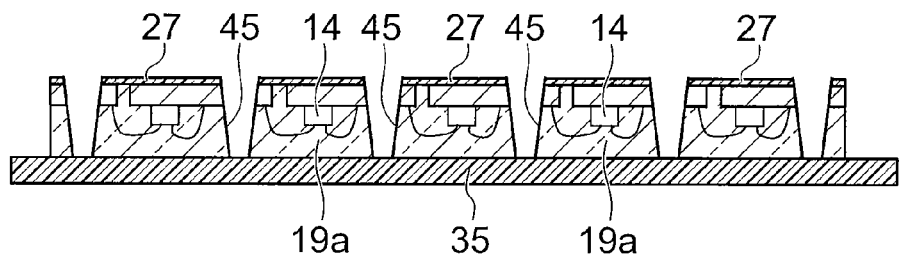

Subsequently, as shown in FIG. 20B, from the back surface side of the metal plate 23, the metal plate 23 and the first resin 19a are cut to form a groove 45. The dicing blade used at this time has a width narrowed in a tapered shape from the root to the edge of the blade. Thus, a groove 45 with a width narrowed from the back surface of the metal plate 23 toward the upper surface of the first resin 19a (in the Z direction) can be formed.

Figure 20C:
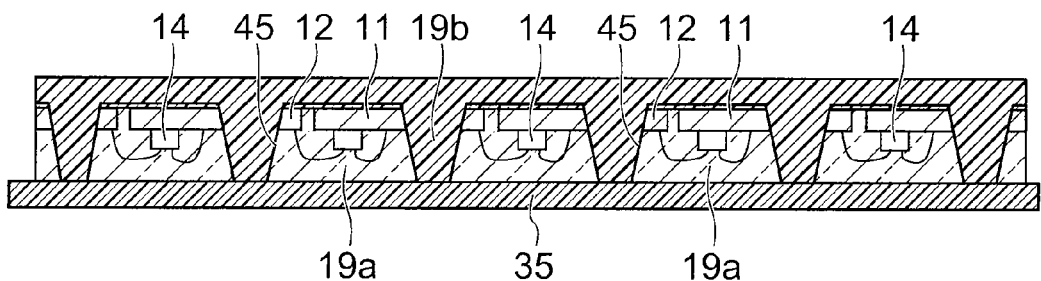

Next, as shown in FIG. 20C, a second resin 19b is molded on the metal plate 23 and filled inside the groove 45. At this time, the width of the groove 45 may be widened by expanding the dicing sheet in the X and Y directions.

Figure 21A:
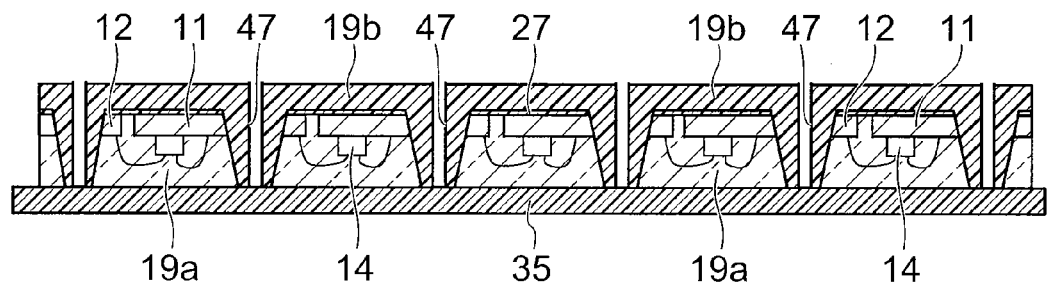
FIGS. 21A to 21C are sectional views schematically illustrating a process following FIGS. 20A to 20C.
Figure 21B:
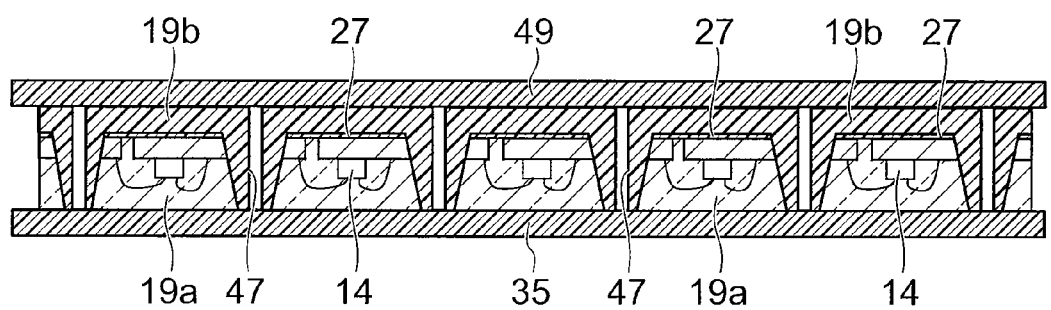
Figure 21C:
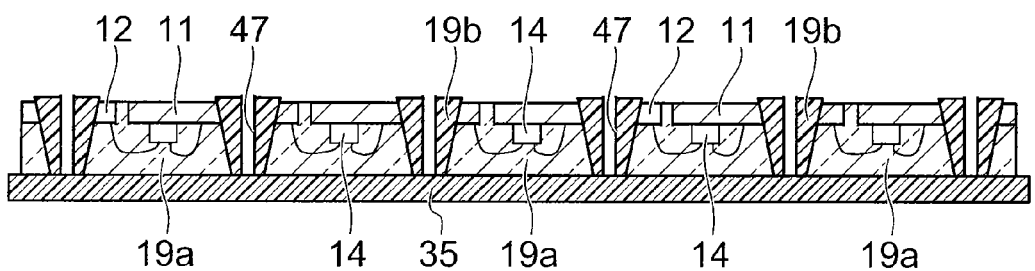

Next, as shown in FIG. 21A, the second resin 19b is cut along the extending direction of the groove 45. Subsequently, as shown in FIG. 21B, an adhesive sheet 49 is affixed to the upper surface of the second resin 19b, and then peeled. Thus, the second resin 19b formed on the back surface of the lead frames 11 and 12 is removed together with the sacrificial sheet 27. Thus, as shown in FIG. 21C, a resin package 18 with the outer edge of the first resin 19a and the outer edge of the lead frames 11 and 12 covered with the second resin 19b can be formed.

As described above, in the semiconductor light emitting device 9 according to this embodiment, the inner surface of the second resin 19b surrounding the first resin 19a is provided in a shape opening in the Z direction. The inner surface causes the emission light of the LED 14a and 14b and the fluorescence of the phosphor 20 dispersed in the first resin 19a to be reflected in the Z direction. This can enhance the directivity of the emission light. The configuration, and operation and effect of this embodiment other than the foregoing are the same as those of the semiconductor light emitting device 6 according to the above fourth embodiment.

(Eighth Embodiment)

Figure 22:
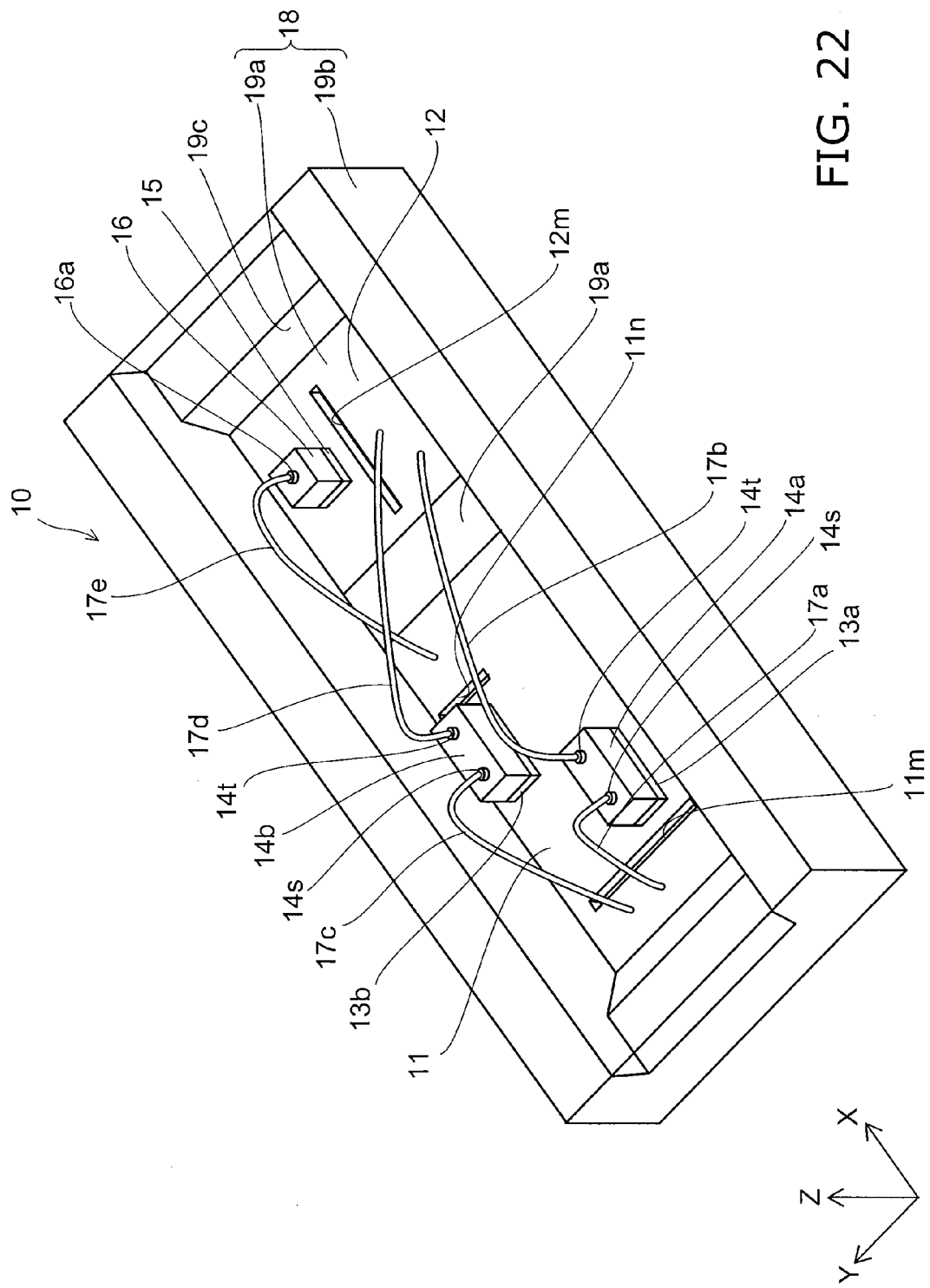
FIG. 22 is a perspective view illustrating a semiconductor light emitting device according to a eighth embodiment.

FIG. 22 is a perspective view illustrating a semiconductor light emitting device 10 according to an eighth embodiment. FIGS. 23A to 23C are schematic views illustrating the detailed structure of the semiconductor light emitting device 10. FIG. 23A is a plan view as viewed in the Z direction. FIG. 23B shows the structure in the A-A' cross section shown in FIG. 23A. FIG. 23C shows the structure in the B-B' cross section shown in FIG. 23A.

As shown in FIGS. 22 to 23C, the semiconductor light emitting device 10 according to this embodiment is different from the semiconductor light emitting device 9 (see FIGS. 18 to 19C) according to the above seventh embodiment in that the height of the portion of the second resin 19b extending in the Y direction is made lower than the height of the portion extending in the X direction. The resin package 18 according to this embodiment can be formed by e.g. making the dicing depth in the Y direction shallower in the step for forming the groove 45 shown in FIG. 20B.

For instance, with reference to the upper surface of the lead frames 11 and 12, the height of the portion of the second resin 19b extending in the Y direction is made approximately half the height of the portion extending in the X direction. Thus, the directivity of the semiconductor light emitting device 10 is increased in the Y direction and decreased in the X direction. Accordingly, the light emission angle in the X direction can be made wider than in the Y direction. The configuration, manufacturing method, and operation and effect of this embodiment other than the foregoing are similar to those of the semiconductor light emitting device 9 according to the above seventh embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor light emitting device, comprising:
preparing a metal plate including a plurality of first frame portions and a plurality of second frame portions, the first frame portions and the second frame portions being alternately arranged, each respective first frame portion having a light emitting element fixed thereto on a front surface side of the metal plate, the light emitting element being connected to an adjacent one of the second frame portions via a metal wire, the adjacent one of the second frame portions being spaced from the respective first frame portion;
molding a first resin on the metal plate, the first resin covering the first frame portions, the second frame portions, and the light emitting elements;
forming a groove in the first resin by cutting the metal plate and the first resin from a back surface side of the metal plate, the groove having sidewalls that slope such that a width of the groove narrows with increasing distance away from the back surface side of the metal plate;
filling the groove with a second resin; and
forming a resin package that includes one first frame portion having a light emitting element fixed thereto and one adjacent second frame portion by cutting through the second resin in the groove.

2. The method according to claim 1, further comprising:
affixing a sacrificial sheet on a surface of the first resin; and
removing the second resin formed on the first resin together with the sacrificial sheet while leaving the second resin filled in the groove.

3. The method according to claim 1, further comprising:
exposing a surface of the first resin by polishing or grinding a surface of the second resin.

4. The method according to claim 1, further comprising:
affixing a dicing sheet to a back surface of the metal plate with the first resin formed thereon, the back surface being on opposite side from the first resin,
wherein the groove is formed so as to extend from a surface of the first resin to the dicing sheet.

5. The method according to claim 4, wherein the second resin is filled in the groove having a width widened by expanding the dicing sheet.

6. The method according to claim 1, wherein the groove is formed from a surface of the first resin to a depth not reaching the metal plate.

7. The method according to claim 1, wherein
the groove is formed from a surface of the first resin to a depth reaching the metal plate, and
the metal plate is half-cut at bottom of the groove.

8. The method according to claim 1, wherein the groove is provided only in a portion extending in one direction of an outer periphery of the resin package.

9. The method according to claim 1, wherein the second resin includes a reflective material that reflects light emitted by the light emitting element.

10. The method according to claim 9, wherein light distribution characteristics are controlled by changing amount of the reflective material included in the second resin.

11. The method according to claim 9, wherein light distribution characteristics are controlled by changing thickness of the second resin.

12. The method according to claim 1, wherein the first resin includes a same material as the second resin.

13. The method according to claim 1, wherein the first resin and the second resin include silicone resin.

14. The method according to claim 1, wherein the first resin includes at least one of a silicate-based phosphor, a YAG-based phosphor, and a sialon-based phosphor.

15. The method according to claim 1, wherein the groove is formed by cutting at least part of the first resin with a dicing blade.

16. The method according to claim 1, wherein the second resin is cut with a dicing blade having a narrower width than the groove.

17. The method according to claim 1, further comprising:
affixing a dicing sheet to an upper surface of the first resin formed on the metal plate; and
affixing a sacrificial sheet on a back surface of the metal plate, the back surface being on opposite side from the first resin,
wherein the groove is formed so as to extend from the back surface of the metal plate to the dicing sheet.

18. The method according to claim 17, wherein the groove is widened by expanding the dicing sheet before the groove is filled with the second resin.

19. The method according to claim 17, further comprising:
removing the second resin formed on back surface of the metal plate together with the sacrificial sheet while leaving the second resin filled in the groove.

20. The method according to claim 17, wherein the groove is formed so as not to expose end surfaces of the first frame portions and the second frame portions.

21. The method of claim 1, further comprising:
affixing a dicing sheet to an upper surface of the first resin before forming the groove in the first resin.

\* \* \* \* \*